(12) United States Patent
Schabes et al.

(10) Patent No.: US 10,319,900 B1
(45) Date of Patent: Jun. 11, 2019

(54) PERPENDICULAR MAGNETIC TUNNEL JUNCTION DEVICE WITH PRECESSIONAL SPIN CURRENT LAYER HAVING A MODULATED MOMENT DENSITY

(71) Applicant: Spin Memory, Inc., Fremont, CA (US)

(72) Inventors: Manfred Ernst Schabes, Saratoga, CA (US); Mustafa Michael Pinarbasi, Morgan Hill, CA (US); Bartlomiej Adam Kardasz, Pleasanton, CA (US)

(73) Assignee: Spin Memory, Inc., Fremont, CA (US)

( * ) Notice: Subject to any disclaimer, the term of this patent is extended or adjusted under 35 U.S.C. 154(b) by 0 days.

(21) Appl. No.: 15/859,381

(22) Filed: Dec. 30, 2017

(51) Int. Cl.
*H01L 43/02* (2006.01)
*H01F 10/32* (2006.01)
(Continued)

(52) U.S. Cl.
CPC ............ *H01L 43/02* (2013.01); *G11C 11/161* (2013.01); *H01F 10/329* (2013.01);
(Continued)

(58) Field of Classification Search
CPC ..... G11C 11/18; G11C 11/15; G11C 11/5607; G11C 11/161; G11C 11/1675;
(Continued)

(56) References Cited

U.S. PATENT DOCUMENTS

| 341,801 A | 5/1886 | Fox |
|---|---|---|
| 5,541,868 A | 7/1996 | Prinz |

(Continued)

FOREIGN PATENT DOCUMENTS

| CA | 2766141 A1 | 1/2011 |
|---|---|---|
| CN | 101036195 A | 9/2008 |

(Continued)

OTHER PUBLICATIONS

Final Office Action dated Nov. 8, 2018 in U.S. Appl. No. 15/445,260.

(Continued)

*Primary Examiner* — Roy K Potter
(74) *Attorney, Agent, or Firm* — Arnold & Porter Kaye Scholer

(57) ABSTRACT

A magnetoresistive random-access memory (MRAM) is disclosed. The MRAM device includes a perpendicular magnetic tunnel junction device having a reference layer, a free layer, and a precessional spin current magnetic layer. The precessional spin current magnetic layer has a non-uniform moment density, and may have a moment density at its center that is greater than a moment density at its perimeter. The device is designed to provide control over the injection of stray fields and the electronic coupling between the precessional spin current magnetic layer and the free layer. Switching speed, switching current, and thermal barrier height for the device can be adjusted. The decreased moment density at the perimeter of the precessional spin current layer helps to stabilize the free layer when the effective magnetic field of the precessional spin current layer is high. Spin accumulation can be increased near the center of the precessional spin current layer, helping to switch the free layer.

21 Claims, 8 Drawing Sheets

(51) Int. Cl.
  *H01L 43/10* (2006.01)
  *H01L 43/12* (2006.01)
  *H01F 41/30* (2006.01)
  *G11C 11/16* (2006.01)
  *H01L 43/08* (2006.01)
  *H01L 27/22* (2006.01)

(52) U.S. Cl.
  CPC ..... *H01F 10/3254* (2013.01); *H01F 10/3272* (2013.01); *H01F 10/3286* (2013.01); *H01F 41/302* (2013.01); *H01L 43/08* (2013.01); *H01L 43/10* (2013.01); *H01L 43/12* (2013.01); *H01L 27/222* (2013.01)

(58) Field of Classification Search
  CPC ............. G11C 11/1695; G11C 11/1673; H01L 27/222; H01L 27/224; H01L 43/02; H01L 43/06; H01L 43/04; H01L 43/065; H01L 43/12; H01L 43/08; H01L 43/10
  See application file for complete search history.

(56) References Cited

U.S. PATENT DOCUMENTS

| | | | |
|---|---|---|---|
| 5,629,549 A | 5/1997 | Johnson |
| 5,640,343 A | 6/1997 | Gallagher et al. |
| 5,654,566 A | 8/1997 | Johnson |
| 5,691,936 A | 11/1997 | Sakakima et al. |
| 5,695,846 A | 12/1997 | Lange et al. |
| 5,695,864 A | 12/1997 | Slonczewski |
| 5,732,016 A | 3/1998 | Chen et al. |
| 5,856,897 A | 1/1999 | Mauri |
| 5,896,252 A | 4/1999 | Kanai |
| 5,966,323 A | 10/1999 | Chen et al. |
| 6,016,269 A | 1/2000 | Peterson et al. |
| 6,055,179 A | 4/2000 | Koganei et al. |
| 6,097,579 A | 8/2000 | Gill |
| 6,124,711 A | 9/2000 | Tanaka et al. |
| 6,134,138 A | 10/2000 | Lu et al. |
| 6,140,838 A | 10/2000 | Johnson |
| 6,154,349 A | 11/2000 | Kanai et al. |
| 6,172,902 B1 | 1/2001 | Wegrowe et al. |
| 6,233,172 B1 | 5/2001 | Chen et al. |
| 6,243,288 B1 | 6/2001 | Ishikawa et al. |
| 6,252,798 B1 | 6/2001 | Satoh et al. |
| 6,256,223 B1 | 7/2001 | Sun |
| 6,292,389 B1 | 9/2001 | Chen et al. |
| 6,347,049 B1 | 2/2002 | Childress et al. |
| 6,376,260 B1 | 4/2002 | Chen et al. |
| 6,385,082 B1 | 5/2002 | Abraham et al. |
| 6,436,526 B1 | 8/2002 | Odagawa et al. |
| 6,458,603 B1 | 10/2002 | Kersch et al. |
| 6,493,197 B2 | 12/2002 | Ito et al. |
| 6,522,137 B1 | 2/2003 | Sun et al. |
| 6,532,164 B2 | 3/2003 | Redon et al. |
| 6,538,918 B2 | 3/2003 | Swanson et al. |
| 6,545,906 B1 | 4/2003 | Savtchenko et al. |
| 6,563,681 B1 | 5/2003 | Sasaki et al. |
| 6,566,246 B1 | 5/2003 | deFelipe et al. |
| 6,603,677 B2 | 8/2003 | Redon et al. |
| 6,653,153 B2 | 11/2003 | Doan et al. |
| 6,654,278 B1 | 11/2003 | Engel et al. |
| 6,677,165 B1 | 1/2004 | Lu et al. |
| 6,710,984 B1 | 3/2004 | Yuasa et al. |
| 6,713,195 B2 | 3/2004 | Wang et al. |
| 6,714,444 B2 | 3/2004 | Huai et al. |
| 6,744,086 B2 | 6/2004 | Daughton et al. |
| 6,750,491 B2 | 6/2004 | Sharma et al. |
| 6,765,824 B2 | 7/2004 | Kishi et al. |
| 6,772,036 B2 | 8/2004 | Eryurek et al. |
| 6,773,515 B2 | 8/2004 | Li et al. |
| 6,777,730 B2 | 8/2004 | Daughton et al. |
| 6,785,159 B2 | 8/2004 | Tuttle |
| 6,812,437 B2 | 11/2004 | Levy et al. |
| 6,829,161 B2 | 12/2004 | Huai et al. |
| 6,835,423 B2 | 12/2004 | Chen et al. |
| 6,838,740 B2 | 1/2005 | Huai et al. |
| 6,842,317 B2 | 1/2005 | Sugita et al. |
| 6,847,547 B2 | 1/2005 | Albert et al. |
| 6,887,719 B2 | 5/2005 | Lu et al. |
| 6,888,742 B1 | 5/2005 | Nguyen et al. |
| 6,902,807 B1 | 6/2005 | Argoitia et al. |
| 6,906,369 B2 | 6/2005 | Ross et al. |
| 6,920,063 B2 | 7/2005 | Huai et al. |
| 6,933,155 B2 | 8/2005 | Albert et al. |
| 6,958,927 B1 | 10/2005 | Nguyen et al. |
| 6,967,863 B2 | 11/2005 | Huai |
| 6,980,469 B2 | 12/2005 | Kent et al. |
| 6,985,385 B2 | 1/2006 | Nguyen et al. |
| 6,992,359 B2 | 1/2006 | Nguyen et al. |
| 6,995,962 B2 | 2/2006 | Saito et al. |
| 7,002,839 B2 | 2/2006 | Kawabata et al. |
| 7,005,958 B2 | 2/2006 | Wan |
| 7,006,375 B2 | 2/2006 | Covington |
| 7,009,877 B1 | 3/2006 | Huai et al. |
| 7,041,598 B2 | 5/2006 | Sharma |
| 7,045,368 B2 | 5/2006 | Hong et al. |
| 7,149,106 B2 | 12/2006 | Mancoff et al. |
| 7,170,778 B2 | 1/2007 | Kent et al. |
| 7,190,611 B2 | 3/2007 | Nguyen et al. |
| 7,203,129 B2 | 4/2007 | Lin et al. |
| 7,227,773 B1 | 6/2007 | Nguyen et al. |
| 7,262,941 B2 | 8/2007 | Li et al. |
| 7,307,876 B2 | 12/2007 | Kent et al. |
| 7,324,387 B1 | 1/2008 | Bergemont et al. |
| 7,335,960 B2 | 2/2008 | Han et al. |
| 7,351,594 B2 | 4/2008 | Bae et al. |
| 7,352,021 B2 | 4/2008 | Bae et al. |
| 7,376,006 B2 | 5/2008 | Bednorz et al. |
| 7,378,699 B2 | 5/2008 | Chan et al. |
| 7,449,345 B2 | 11/2008 | Horng et al. |
| 7,476,919 B2 | 1/2009 | Hong et al. |
| 7,502,249 B1 | 3/2009 | Ding |
| 7,573,737 B2 | 8/2009 | Kent et al. |
| 7,598,555 B1 | 10/2009 | Papworth-Parkin |
| 7,619,431 B2 | 11/2009 | DeWilde et al. |
| 7,630,232 B2 | 12/2009 | Guo |
| 7,643,332 B2 | 1/2010 | Leuschner |
| 7,679,155 B2 | 3/2010 | Korenivski |
| 7,911,832 B2 | 3/2011 | Kent et al. |
| 7,936,595 B2 | 5/2011 | Han et al. |
| 7,986,544 B2 | 7/2011 | Kent et al. |
| 8,014,193 B2 | 9/2011 | Nakayama et al. |
| 8,279,663 B2 | 10/2012 | Nakayama et al. |
| 8,279,666 B2 | 10/2012 | Dieny et al. |
| 8,334,213 B2 | 12/2012 | Mao |
| 8,357,982 B2 | 1/2013 | Kajiyama |
| 8,363,465 B2 | 1/2013 | Kent et al. |
| 8,456,883 B1 | 6/2013 | Liu |
| 8,488,375 B2 | 7/2013 | Saida et al. |
| 8,492,881 B2 | 7/2013 | Kuroiwa et al. |
| 8,508,979 B2 | 8/2013 | Saida et al. |
| 8,535,952 B2 | 9/2013 | Ranjan et al. |
| 8,574,928 B2 | 11/2013 | Satoh et al. |
| 8,576,616 B2 | 11/2013 | Saida et al. |
| 8,582,355 B2 | 11/2013 | Saida et al. |
| 8,617,408 B2 | 12/2013 | Balamane |
| 8,716,817 B2 | 5/2014 | Saida et al. |
| 8,737,122 B2 | 5/2014 | Saida et al. |
| 8,737,137 B1 | 5/2014 | Choy et al. |
| 8,779,537 B2 | 7/2014 | Huai |
| 8,823,118 B2 | 9/2014 | Horng |
| 8,852,760 B2 | 10/2014 | Wang et al. |
| 8,860,156 B2 | 10/2014 | Beach |
| 8,878,317 B2 | 11/2014 | Daibou et al. |
| 9,019,754 B1 | 4/2015 | Bedeschi |
| 9,025,368 B2 | 5/2015 | Saida et al. |
| 9,082,888 B2 | 7/2015 | Kent et al. |
| 9,117,995 B2 | 8/2015 | Daibou et al. |
| 9,159,342 B2 | 10/2015 | Kudo et al. |
| 9,245,608 B2 | 1/2016 | Chen et al. |
| 9,263,667 B1 | 2/2016 | Pinarbasi |
| 9,299,918 B2 | 3/2016 | Daibou et al. |
| 9,337,412 B2 | 3/2016 | Pinarbasi et al. |

(56) References Cited

U.S. PATENT DOCUMENTS

| | | |
|---|---|---|
| 9,362,486 B2 | 6/2016 | Kim et al. |
| 9,378,817 B2 | 6/2016 | Lee et al. |
| 9,379,314 B2 | 6/2016 | Park |
| 9,406,876 B2 | 8/2016 | Pinarbasi |
| 9,472,282 B2 | 10/2016 | Lee et al. |
| 9,472,748 B2 | 10/2016 | Kuo et al. |
| 9,484,527 B2 | 11/2016 | Han et al. |
| 9,548,445 B2 | 1/2017 | Lee et al. |
| 9,589,616 B2 | 3/2017 | Meng et al. |
| 9,728,712 B2 | 8/2017 | Kardasz et al. |
| 9,741,926 B1 | 8/2017 | Pinarbasi et al. |
| 9,773,540 B2 | 9/2017 | Zang et al. |
| 9,773,974 B2 | 9/2017 | Pinarbasi et al. |
| 9,777,974 B2 | 10/2017 | Kamitani et al. |
| 9,818,464 B2 | 11/2017 | Saida et al. |
| 9,853,206 B2 * | 12/2017 | Pinarbasi ............... H01L 43/08 |
| 10,008,248 B2 | 6/2018 | Buhrman et al. |
| 10,026,892 B2 | 7/2018 | Pinarbasi et al. |
| 10,032,978 B1 | 7/2018 | Schabes et al. |
| 2002/0090533 A1 | 7/2002 | Zhang et al. |
| 2002/0105823 A1 | 8/2002 | Redon et al. |
| 2002/0132140 A1 | 9/2002 | Igarashi et al. |
| 2003/0117840 A1 | 6/2003 | Sharma et al. |
| 2003/0151944 A1 | 8/2003 | Saito |
| 2003/0197984 A1 | 10/2003 | Inomata et al. |
| 2003/0218903 A1 | 11/2003 | Luo |
| 2004/0012994 A1 | 1/2004 | Slaughter et al. |
| 2004/0061154 A1 | 4/2004 | Huai et al. |
| 2004/0094785 A1 | 5/2004 | Zhu et al. |
| 2004/0125649 A1 | 7/2004 | Durlam et al. |
| 2004/0130936 A1 | 7/2004 | Nguyen et al. |
| 2004/0257717 A1 | 12/2004 | Sharma et al. |
| 2005/0041342 A1 | 2/2005 | Huai et al. |
| 2005/0051820 A1 | 3/2005 | Stojakovic et al. |
| 2005/0063222 A1 | 3/2005 | Huai et al. |
| 2005/0104101 A1 | 5/2005 | Sun et al. |
| 2005/0128842 A1 | 6/2005 | Wei |
| 2005/0136600 A1 | 6/2005 | Huai |
| 2005/0158881 A1 | 7/2005 | Sharma |
| 2005/0174702 A1 | 8/2005 | Gill |
| 2005/0180202 A1 | 8/2005 | Huai et al. |
| 2005/0184839 A1 | 8/2005 | Nguyen et al. |
| 2005/0201023 A1 | 9/2005 | Huai et al. |
| 2005/0237787 A1 | 10/2005 | Huai et al. |
| 2005/0280058 A1 | 12/2005 | Pakala et al. |
| 2006/0002184 A1 | 1/2006 | Hong et al. |
| 2006/0018057 A1 | 1/2006 | Huai |
| 2006/0044703 A1 | 3/2006 | Inomata et al. |
| 2006/0049472 A1 | 3/2006 | Diao et al. |
| 2006/0087880 A1 | 4/2006 | Mancoff et al. |
| 2006/0092696 A1 | 5/2006 | Bessho |
| 2006/0132990 A1 | 6/2006 | Morise et al. |
| 2006/0227465 A1 | 10/2006 | Inokuchi et al. |
| 2007/0019337 A1 | 1/2007 | Apalkov et al. |
| 2007/0047294 A1 | 3/2007 | Panchula |
| 2007/0096229 A1 | 5/2007 | Yoshikawa et al. |
| 2007/0242501 A1 | 10/2007 | Hung et al. |
| 2007/0259209 A1 * | 11/2007 | Slavin ............... B82Y 25/00 428/692.1 |
| 2008/0031035 A1 | 2/2008 | Rodmacq et al. |
| 2008/0049488 A1 | 2/2008 | Rizzo |
| 2008/0112094 A1 | 5/2008 | Kent et al. |
| 2008/0151442 A1 | 6/2008 | Mauri et al. |
| 2008/0151614 A1 | 6/2008 | Guo |
| 2008/0179699 A1 * | 7/2008 | Horng ............... H01L 43/08 257/421 |
| 2008/0259508 A2 | 10/2008 | Kent et al. |
| 2008/0291720 A1 * | 11/2008 | Wang ............... H01L 43/08 365/173 |
| 2008/0297292 A1 | 12/2008 | Viala et al. |
| 2009/0046501 A1 | 2/2009 | Ranjan et al. |
| 2009/0072185 A1 | 3/2009 | Raksha et al. |
| 2009/0091037 A1 | 4/2009 | Assefa et al. |
| 2009/0098413 A1 | 4/2009 | Kanegae |
| 2009/0161421 A1 | 6/2009 | Cho et al. |
| 2009/0209050 A1 | 8/2009 | Wang et al. |
| 2009/0209102 A1 | 8/2009 | Zhong et al. |
| 2009/0231909 A1 | 9/2009 | Dieny et al. |
| 2010/0019333 A1 | 1/2010 | Zhao et al. |
| 2010/0124091 A1 | 5/2010 | Cowburn |
| 2010/0193891 A1 | 8/2010 | Wang et al. |
| 2010/0232206 A1 | 9/2010 | Li |
| 2010/0246254 A1 | 9/2010 | Prejbeanu et al. |
| 2010/0271870 A1 | 10/2010 | Zheng et al. |
| 2010/0290275 A1 | 11/2010 | Park et al. |
| 2010/0304204 A1 | 12/2010 | Routkevitch et al. |
| 2011/0001108 A1 | 1/2011 | Greene et al. |
| 2011/0032645 A1 | 2/2011 | Noel et al. |
| 2011/0058412 A1 | 3/2011 | Zheng et al. |
| 2011/0089511 A1 | 4/2011 | Keshtbod et al. |
| 2011/0121417 A1 | 5/2011 | Li |
| 2011/0133298 A1 | 6/2011 | Chen et al. |
| 2011/0141804 A1 | 6/2011 | Apalkov et al. |
| 2011/0149632 A1 | 6/2011 | Chen et al. |
| 2011/0216436 A1 | 9/2011 | Igarashi |
| 2011/0305077 A1 | 12/2011 | Higo et al. |
| 2012/0052258 A1 | 3/2012 | Op DeBeeck et al. |
| 2012/0069649 A1 | 3/2012 | Ranjan et al. |
| 2012/0120520 A1 | 5/2012 | Childress et al. |
| 2012/0155156 A1 | 6/2012 | Watts |
| 2012/0156390 A1 | 6/2012 | Araki |
| 2012/0181642 A1 | 7/2012 | Prejbeanu et al. |
| 2012/0188818 A1 | 7/2012 | Ranjan et al. |
| 2012/0228728 A1 | 9/2012 | Ueki et al. |
| 2012/0280336 A1 | 11/2012 | Jan |
| 2012/0280339 A1 | 11/2012 | Zhang et al. |
| 2012/0294078 A1 | 11/2012 | Kent et al. |
| 2012/0299133 A1 | 11/2012 | Son et al. |
| 2013/0001506 A1 | 1/2013 | Sato et al. |
| 2013/0001652 A1 | 1/2013 | Yoshikawa et al. |
| 2013/0021841 A1 | 1/2013 | Zhou et al. |
| 2013/0062714 A1 | 3/2013 | Zhu |
| 2013/0075845 A1 | 3/2013 | Chen et al. |
| 2013/0119495 A1 | 5/2013 | Vetro et al. |
| 2013/0157385 A1 | 6/2013 | Jung et al. |
| 2013/0244344 A1 | 9/2013 | Malmhall et al. |
| 2013/0267042 A1 | 10/2013 | Satoh et al. |
| 2013/0270523 A1 | 10/2013 | Wang et al. |
| 2013/0270661 A1 | 10/2013 | Yi et al. |
| 2013/0307097 A1 | 11/2013 | Yi et al. |
| 2013/0341801 A1 | 12/2013 | Satoh et al. |
| 2014/0009994 A1 | 1/2014 | Parkin et al. |
| 2014/0036573 A1 | 2/2014 | Ishihara et al. |
| 2014/0042571 A1 | 2/2014 | Gan et al. |
| 2014/0048896 A1 | 2/2014 | Huang et al. |
| 2014/0070341 A1 | 3/2014 | Beach et al. |
| 2014/0087483 A1 | 3/2014 | Ohsawa |
| 2014/0093701 A1 | 4/2014 | Sahoo et al. |
| 2014/0103472 A1 | 4/2014 | Kent et al. |
| 2014/0131824 A1 | 5/2014 | Kitagawa et al. |
| 2014/0169085 A1 | 6/2014 | Wang et al. |
| 2014/0177316 A1 | 6/2014 | Otsuka et al. |
| 2014/0217531 A1 | 8/2014 | Jan |
| 2014/0252439 A1 | 9/2014 | Guo |
| 2014/0252519 A1 | 9/2014 | Kim |
| 2014/0264671 A1 | 9/2014 | Chepulskyy et al. |
| 2015/0008550 A1 | 1/2015 | Min et al. |
| 2015/0056368 A1 | 2/2015 | Wang et al. |
| 2015/0171316 A1 | 6/2015 | Park et al. |
| 2015/0249205 A1 * | 9/2015 | Suwa ............... H01L 43/08 257/421 |
| 2015/0279904 A1 | 10/2015 | Pinarbasi |
| 2015/0287910 A1 | 10/2015 | Lu |
| 2015/0357015 A1 | 12/2015 | Kent et al. |
| 2015/0372687 A1 | 12/2015 | Buhrman et al. |
| 2016/0027999 A1 | 1/2016 | Pinarbasi |
| 2016/0087193 A1 | 3/2016 | Pinarbasi et al. |
| 2016/0093798 A1 | 3/2016 | Kim et al. |
| 2016/0099405 A1 | 4/2016 | Zimmer et al. |
| 2016/0111634 A1 | 4/2016 | Lee et al. |
| 2016/0126452 A1 | 5/2016 | Kuo et al. |
| 2016/0126453 A1 | 5/2016 | Chen et al. |
| 2016/0163965 A1 | 6/2016 | Han et al. |
| 2016/0163973 A1 | 6/2016 | Pinarbasi |

(56) References Cited

U.S. PATENT DOCUMENTS

| | | |
|---|---|---|
| 2016/0181508 A1 | 6/2016 | Lee et al. |
| 2016/0218278 A1 | 7/2016 | Pinarbasi et al. |
| 2016/0276006 A1 | 9/2016 | Ralph et al. |
| 2016/0284762 A1 | 9/2016 | Wang et al. |
| 2016/0315118 A1 | 10/2016 | Kardasz et al. |
| 2016/0315259 A1 | 10/2016 | Kardasz et al. |
| 2016/0372656 A1 | 12/2016 | Pinarbasi et al. |
| 2017/0025472 A1 | 1/2017 | Kim et al. |
| 2017/0033156 A1 | 2/2017 | Gan et al. |
| 2017/0033283 A1 | 2/2017 | Pinarbasi et al. |
| 2017/0033742 A1 | 2/2017 | Akerman |
| 2017/0047107 A1 | 2/2017 | Berger et al. |
| 2017/0084826 A1 | 3/2017 | Zhou et al. |
| 2017/0222132 A1 | 8/2017 | Pinarbasi et al. |
| 2017/0236570 A1 | 8/2017 | Kent et al. |
| 2017/0324029 A1 | 11/2017 | Pinarbasi et al. |
| 2017/0331032 A1 | 11/2017 | Chen et al. |
| 2017/0331033 A1 | 11/2017 | Kardasz et al. |
| 2017/0346002 A1 | 11/2017 | Pinarbasi et al. |
| 2018/0047894 A1 | 2/2018 | Pinarbasi et al. |
| 2018/0076382 A1 | 3/2018 | Park et al. |
| 2018/0114898 A1 | 4/2018 | Lee |
| 2018/0205001 A1 | 7/2018 | Beach et al. |
| 2018/0248110 A1 | 8/2018 | Kardasz et al. |
| 2018/0248113 A1 | 8/2018 | Pinarbasi et al. |

FOREIGN PATENT DOCUMENTS

| | | |
|---|---|---|
| CN | 102334207 A | 1/2012 |
| CN | 102959693 A | 3/2013 |
| CN | 105706259 A | 6/2016 |
| CN | 105917480 A | 8/2016 |
| CN | 106062979 A | 10/2016 |
| CN | 107750382 A | 3/2018 |
| CN | 107851712 A | 3/2018 |
| EP | 1345277 A1 | 9/2003 |
| EP | 3298636 A1 | 3/2018 |
| FR | 2817998 A1 | 6/2002 |
| FR | 2832542 A1 | 5/2003 |
| FR | 2910716 A1 | 6/2008 |
| JP | H10-004012 A | 1/1998 |
| JP | H11-120758 A | 4/1999 |
| JP | H11-352867 A | 12/1999 |
| JP | 2001-195878 A | 7/2001 |
| JP | 2002-261352 A | 9/2002 |
| JP | 2002-357489 A | 12/2002 |
| JP | 2003-318461 A | 11/2003 |
| JP | 2005-044848 | 2/2005 |
| JP | 2005-150482 A | 6/2005 |
| JP | 2005-535111 A | 11/2005 |
| JP | 4066477 B2 | 3/2006 |
| JP | 2006-128579 A | 5/2006 |
| JP | 2008-524830 A | 7/2008 |
| JP | 2009-027177 A | 2/2009 |
| JP | 2012-004222 | 1/2012 |
| JP | 2013-012546 A | 1/2013 |
| JP | 2013-048210 | 3/2013 |
| JP | 2013-219010 A | 10/2013 |
| JP | 2014-039061 A | 2/2014 |
| JP | 5635666 B2 | 12/2014 |
| JP | 2015-002352 A | 1/2015 |
| JP | 2017-510989 A | 4/2017 |
| JP | 2017-527097 A | 9/2017 |
| JP | 2017-532752 A | 11/2017 |
| KR | 10-2014-0115246 A | 9/2014 |
| KR | 10-2015-0016162 A | 2/2015 |
| WO | WO 2009-080636 A1 | 7/2009 |
| WO | WO 2011-005484 A2 | 1/2011 |
| WO | WO 2014-062681 A1 | 4/2014 |
| WO | WO-2015-153142 A1 | 10/2015 |
| WO | 2016011435 A1 | 1/2016 |
| WO | WO-2016-014326 A1 | 1/2016 |
| WO | WO-2016-048603 A1 | 3/2016 |
| WO | WO-2016-171800 A1 | 10/2016 |
| WO | WO-2016-171920 A1 | 10/2016 |
| WO | WO-2016-204835 A1 | 12/2016 |
| WO | WO-2017-019134 A1 | 2/2017 |
| WO | WO-2017-030647 A1 | 2/2017 |
| WO | WO-2017-131894 A1 | 8/2017 |
| WO | WO 2017/151735 A1 | 9/2017 |

OTHER PUBLICATIONS

Final Office Action dated Nov. 16, 2018 in U.S. Appl. No. 15/445,362.
Final Office Action dated Dec. 13, 2018 in U.S. Appl. No. 15/091,853.
NonFinal Office Action dated Nov. 23, 2018 in U.S. Appl. No. 15/859,384.
NonFinal Office Action dated Nov. 26, 2018 in U.S. Appl. No. 15/858,950.
Notice of Allowance dated Oct. 24, 2018 in U.S. Appl. No. 15/859,517.
Notice of Allowance dated Nov. 9, 2018 in U.S. Appl. No. 15/859,015.
Notice of Allowance dated Nov. 21, 2018 in U.S. Appl. No. 15/859,030.
Notice of Allowance dated Nov. 21, 2018 in U.S. Appl. No. 15/859,374.
Notice of Allowance dated Nov. 30, 2018 in U.S. Appl. No. 15/859,514.
Notice of Allowance dated Dec. 12, 2018 in U.S. Appl. No. 15/858,988.
Office Action dated Oct. 9, 2018 in Japanese Patent Application No. 2016-526761.
International Search Report and Written Opinion dated May 10, 2018 in PCT/US2018/014645; 14 pages.
International Search Report and Written Opinion dated May 30, 2018 in PCT/US2018/014641; 13 pages.
R.H. Koch, et al., "Thermally Assisted Magnetization Reversal in Submicron-Sized Magnetic Thin Films"; Physical Review Letters; The American Physical Society; vol. 84, No. 23; Jun. 5, 2000, pp. 5419-5422 (4 pages).
K.J. Lee, et al., "Analytical investigation of spin-transfer dynamics using a perpendicular-to-plane polarizer"; Applied Physics Letters; American Institute of Physics; vol. 86, (2005); pp. 022505-1 to 022505-3 (3 pages).
Kirsten Martens, et al., "Thermally Induced Magnetic Switching in Thin Ferromagnetic Annuli"; NSF grants PHY-0351964 (DLS); 2005; 11 pages.
Kirsten Martens, et al., "Magnetic Reversal in Nanoscopic Ferromagnetic Rings"; NSF grants PHY-0351964 (DLS); 2006; 23 pages.
"Magnetic Technology Sprintronics, Media and Interface"; Data Storage Institute, R&D Highlights; Sep. 2010; 3 pages.
S. Ikeda, et al.; "A perpendicular-anisotropy CoFeB—MgO magnetic tunnel junction"; Nature Materials, vol. 9, Sep. 2010; pp. 721-724; 4 pages.
Soo-Man Seo, et al.; "Current-induced synchronized switching of magnetization;" Applied Physics Letters 101; 2012 American Institute of Physics; Aug. 7, 2012; 6 pages.
Kent, et al.; U.S. Appl. No. 61/715,111, filed Oct. 17, 2012, entitled "Inverted Orthogonal Spin Transfer Layer Stack".
Pinarbasi, et al.; U.S. Appl. No. 14/341,185, filed Jul. 25, 2014, entitled "Method for Manufacturing MTJ Memory Device".
Pinarbasi, et al.; U.S. Appl. No. 14/492,943, filed Sep. 22, 2014, entitled "Magnetic Tunnel Junction Structure for MRAM Device".
International Search Report and Written Opinion dated Jul. 10, 2015 in PCT/US2015/021580; 12 pages.
Pinarbasi, et al.; U.S. Appl. No. 14/814,036, filed Jul. 30, 2015, entitled "Precessional Spin Current Structure for MRAM".
Kardasz, et al.; U.S. Appl. No. 14/866,359, filed Sep. 25, 2015, entitled "Spin Transfer Torque Structure for MRAM Devices Having a Spin Current Injection Capping Layer".
International Search Report and Written Opinion dated Oct. 30, 2015 in PCT/US2015/040700; 11 pages.
International Search Report and Written Opinion dated Dec. 14, 2015 in PCT/US2015/047875; 13 pages.
Pinarbasi, et al.; U.S. Appl. No. 15/041,325, filed Feb. 11, 2016, entitled "Method for Manufacturing MTJ Memory Device".

(56) References Cited

OTHER PUBLICATIONS

Kardasz, et al.; U.S. Appl. No. 15/091,853, filed Apr. 6, 2016, entitled "High Annealing Temperature Perpendicular Magnetic Anisotropy Structure for Magnetic Random Access Memory".
Pinarbasi, et al.; U.S. Appl. No. 15/093,367, filed Apr. 7, 2016, entitled "Magnetic Tunnel Junction Structure for MRAM Device".
Pinarbasi, et al.; U.S. Appl. No. 15/097,576, filed Apr. 13, 2016, entitled "Polishing Stop Layer(s) for Processing Arrays of Semiconductor Elements".
Pinarbasi, et al.; U.S. Appl. No. 15/157,783, filed May 18, 2016, entitled "Memory Cell Having Magnetic Tunnel Junction and Thermal Stability Enhancement Layer".
Berger, et al.; U.S. Appl. No. 15/174,482, filed Jun. 6, 2016, entitled "Method and Apparatus for Bipolar Memory Write-Verify".
International Search Report and Written Opinion dated Jun. 17, 2016 in PCT/US2016/021324; 9 pages.
International Search Report and Written Opinion dated Jun. 17, 2016 in PCT/US2016/021691; 9 pages.
International Search Report and Written Opinion dated Jul. 15, 2016 in PCT/US2016/026473; 9 pages.
International Search Report and Written Opinion dated Jul. 21, 2016 in PCT/US2016/027445; 10 pages.
International Search Report and Written Opinion dated Sep. 26, 2016 in PCT/US2016/037843; 10 pages.
Pinarbasi, et al.; U.S. Appl. No. 15/445,260, filed Feb. 28, 2017, entitled "Precessional Spin Current Structure for MRAM".
Pinarbasi, et al.; U.S. Appl. No. 15/445,362, filed Feb. 28, 2017, entitled "Precessional Spin Current Structure for MRAM".
International Search Report and Written Opinion dated Apr. 7, 2017 in PCT/US2016/067444; 13 pages.
Notice of Allowance dated Apr. 21, 2017 in U.S. Appl. No. 15/157,783; 36 pages.
Pinarbasi, et al.; U.S. Appl. No. 15/656,398, filed Jul. 21, 2017, entitled "Memory Cell Having Magnetic Tunnel Junction and Thermal Stability Enhancement Layer".
Kardasz, et al.; U.S. Appl. No. 15/657,498, filed Jul. 24, 2017, entitled "Spin Transfer Torque Structure for MRAM Devices Having a Spin Current Injection Capping Layer".
Notice of Allowance dated Jul. 27, 2017 in U.S. Appl. No. 15/097,576; 22 pages.
Pinarbasi, et al.; U.S. Appl. No. 15/674,620, filed Aug. 11, 2017, entitled "Polishing Stop Layer(s) for Processing Arrays of Semiconductor Elements".
Schabes, et al.; U.S. Appl. No. 15/634,629, filed Jun. 27, 2017, entitled "MRAM with Reduced Stray Magnetic Fields".
Notice of Allowance dated Oct. 16, 2017 in U.S. Appl. No. 14/814,036; 16 pages.
Pinarbasi, et al.; U.S. Appl. No. 15/794,871, filed Oct. 26, 2017, entitled "Precessional Spin Current Structure for MRAM".
Tzoufras, et al.; U.S. Appl. No. 15/858,950, filed Dec. 29, 2017, entitled "AC Current Pre-Charge Write-Assist in Orthogonal STT-MRAM".

Gajek, et al.; U.S. Appl. No. 15/858,988, filed Dec. 29, 2017, entitled "Self-Generating AC Current Assist in Orthogonal STT MRAM".
Ryan, et al.; U.S. Appl. No. 15/859,015, filed Dec. 29, 2017, entitled "Shared Oscillator (STNO) for MRAM Array Write-Assist in Orthogonal STT-MRAM".
Tzoufras, et al.; U.S. Appl. No. 15/859,030, filed Dec. 29, 2017, entitled "AC Current Write-Assist in Orthogonal STT-MRAM".
Bozdag, et al.; U.S. Appl. No. 15/859,047, filed Dec. 29, 2017, entitled "Three-Terminal MRAM with AC Write-Assist for Low Read Disturb".
Schabes, et al.; U.S. Appl. No. 15/862,788, filed Jan. 5, 2018, entitled "Perpendicular Magnetic Tunnel Junction Device with Skyrmionic Enhancement Layers for the Precessional Spin Current Magnetic Layer".
Schabes, et al.; U.S. Appl. No. 15/859,384, filed Dec. 30, 2017, entitled "Perpendicular Magnetic Tunnel Junction Device with Skyrmionic Assist Layers for Free Layer Switching".
Schabes, et al.; U.S. Appl. No. 15/859,379, filed Dec. 30, 2017, entitled "Perpendicular Magnetic Tunnel Junction Device with Offset Precessional Spin Current Layer".
Schabes, et al.; U.S. Appl. No. 15/859,374, filed Dec. 30, 2017, entitled "Switching and Stability Control for Perpendicular Magnetic Tunnel Junction Device".
El Baraji, et al.; U.S. Appl. No. 15/859,514, filed Dec. 30, 2017, entitled "Microwave Write-Assist in Orthogonal STT-MRAM".
El Baraji, et al.; U.S. Appl. No. 15/859,517, filed Dec. 30, 2017, entitled "Microwave Write-Assist in Series-Interconnected Orthogonal STT-MRAM Devices".
Final Office Action dated Jul. 9, 2015 in U.S. Appl. No. 14/242,419; 19 pages.
Final Office Action dated Jun. 9, 2017 in U.S. Appl. No. 14/814,038; 19 pages.
Final Office Action dated Aug. 2, 2018 in U.S. Appl. No. 15/674,620.
NonFinal Office Action dated Dec. 23, 2016 in U.S. Appl. No. 15/093,367; 13 pages.
NonFinal Office Action dated Jan. 25, 2017 in U.S. Appl. No. 15/097,576; 17 pages.
NonFinal Office Action dated Feb. 6, 2017 in U.S. Appl. No. 14/814,036; 22 pages.
NonFinal Office Action dated Jun. 29, 2018 in U.S. Appl. No. 15/859,381.
Nonfinal Office Action dated Jun. 26, 2018 in U.S. Appl. No. 15/859,384.
NonFinal Office Action dated Jun. 29, 2018 in U.S. Appl. No. 15/859,374.
Notice of Allowance dated Sep. 26, 2018 in U.S. Appl. No. 15/859,047; 10 pages.
Office Action dated Aug. 30, 2018 in Chinese Patent Application No. 201580009984.2.
NonFinal Office Action dated Jan. 15, 2019 in U.S. Appl. No. 15/862,788.

* cited by examiner

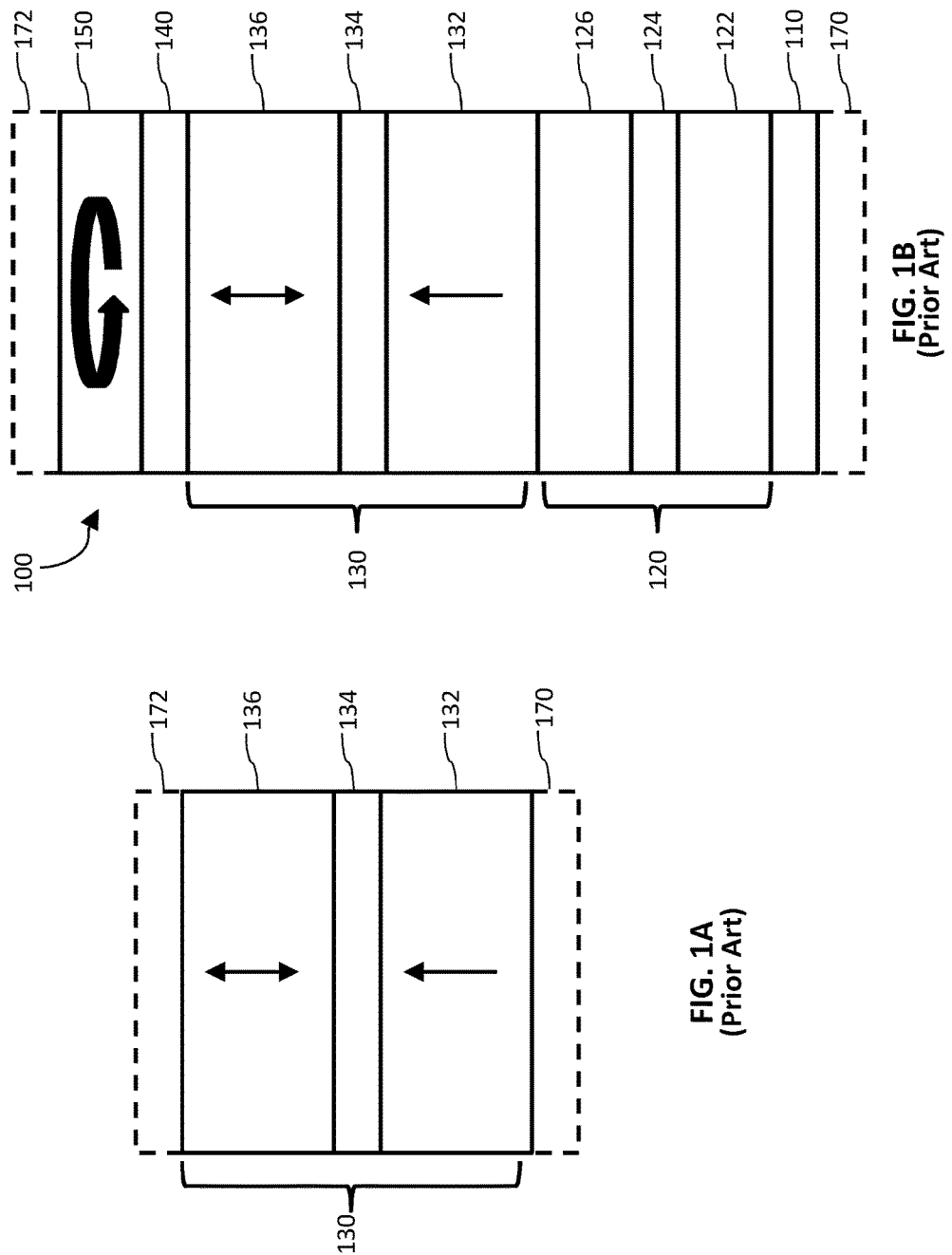

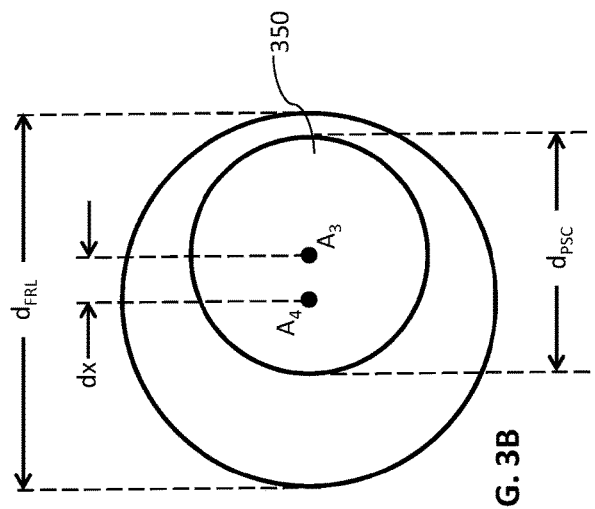
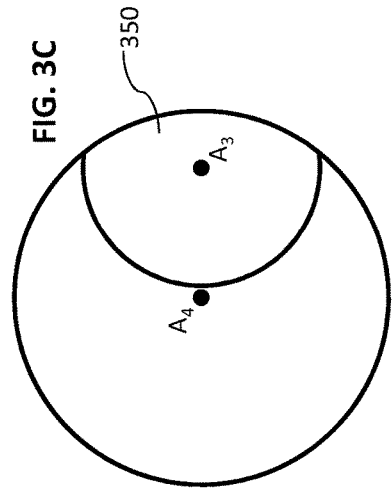
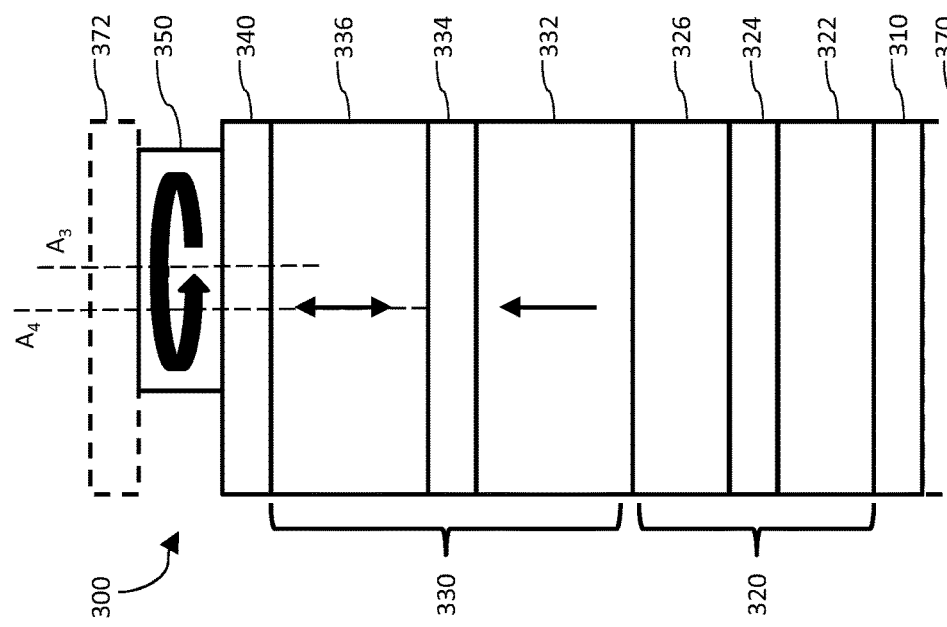

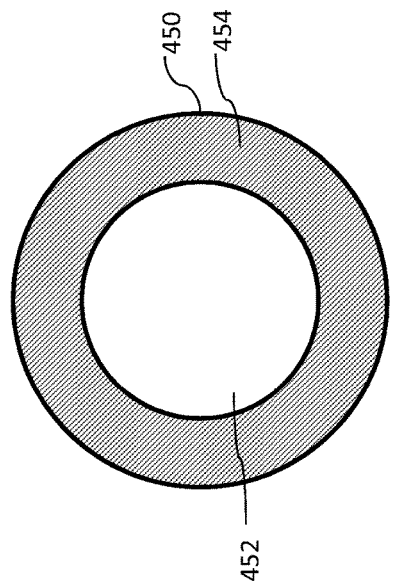
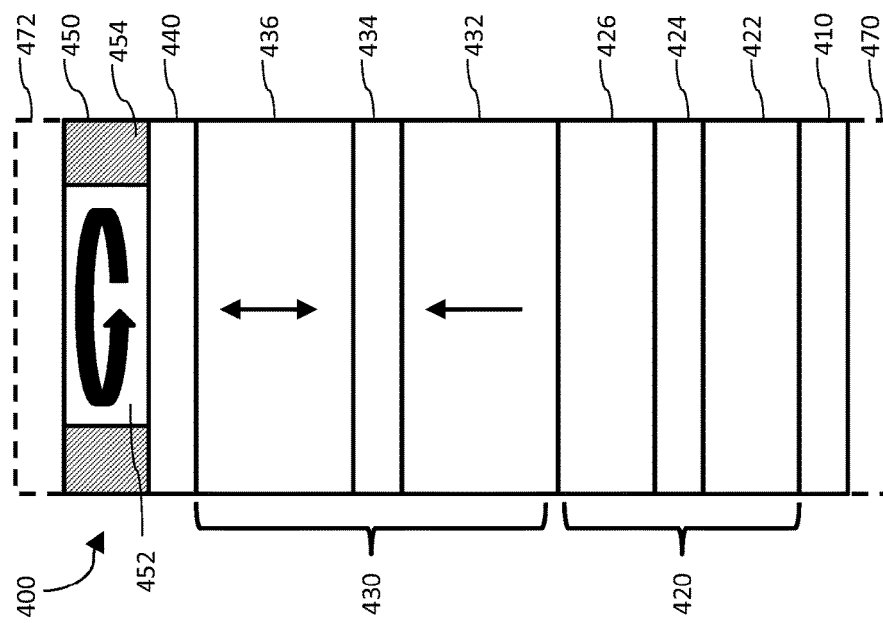

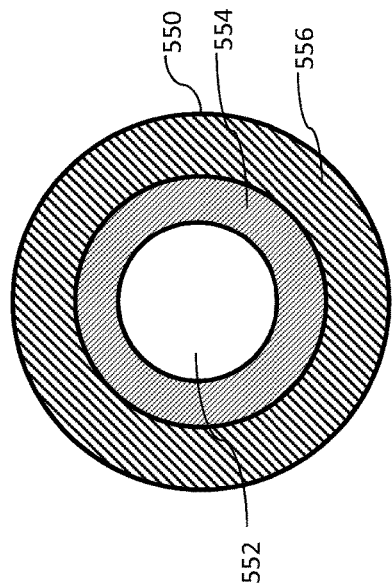
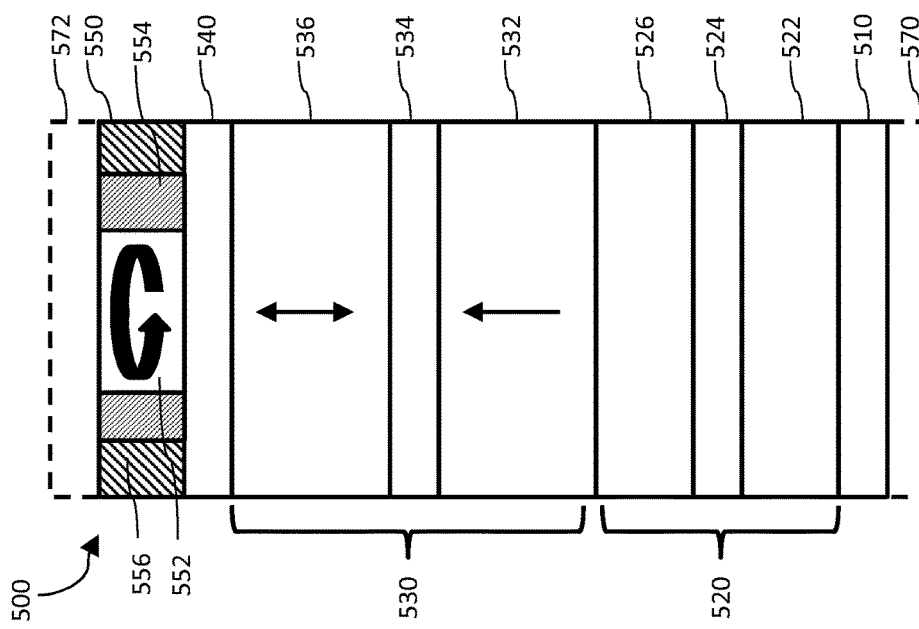
FIG. 5B
FIG. 5A

PERPENDICULAR MAGNETIC TUNNEL JUNCTION DEVICE WITH PRECESSIONAL SPIN CURRENT LAYER HAVING A MODULATED MOMENT DENSITY

CROSS-REFERENCE TO RELATED APPLICATIONS

Cross-reference is made to the following related applications, all of which are filed concurrently herewith, incorporated herein by reference, and assigned to assignee of this patent document: U.S. application Ser. No. 15/859,374, entitled "SWITCHING AND STABILITY CONTROL FOR PERPENDICULAR MAGNETIC TUNNEL JUNCTION DEVICE," U.S. application Ser. No. 15/859,379, entitled "PERPENDICULAR MAGNETIC TUNNEL JUNCTION DEVICE WITH OFFSET PRECESSIONAL SPIN CURRENT LAYER," U.S. application Ser. No. 15/862,788, entitled "PERPENDICULAR MAGNETIC TUNNEL JUNCTION DEVICE WITH SKYRMIONIC ENHANCEMENT LAYERS FOR THE PRECESSIONAL SPIN CURRENT MAGNETIC LAYER," and U.S. application Ser. No. 15/859,384, entitled "PERPENDICULAR MAGNETIC TUNNEL JUNCTION DEVICE WITH SKYRMIONIC ASSIST LAYERS FOR FREE LAYER SWITCHING."

FIELD

The present patent document relates generally to magnetic random access memory and, more particularly, to a magnetic tunnel junction stack having a precessional spin current layer that is designed to provide switching and stability control for the device.

BACKGROUND

Magnetoresistive random-access memory ("MRAM") is a non-volatile memory technology that stores data through magnetic storage elements. These elements are two ferromagnetic plates or electrodes that can hold magnetization and are separated by a non-magnetic material, such as a non-magnetic metal or insulator. In general, one of the plates has its magnetization pinned (i.e., a "reference layer"), meaning that this layer has a higher coercivity than the other layer and requires a larger magnetic field or spin-polarized current to change the orientation of its magnetization. The second plate is typically referred to as the free layer and its magnetization direction can be changed by a smaller magnetic field or spin-polarized current relative to the reference layer.

MRAM devices store information by changing the orientation of the magnetization of the free layer. In particular, based on whether the free layer is in a parallel or anti-parallel alignment relative to the reference layer, either a "1" or a "0" can be stored in each MRAM cell. Due to the spin-polarized electron tunneling effect, the electrical resistance of the cell changes due to the orientation of the magnetization of the two layers. The cell's resistance will be different for the parallel and anti-parallel states and thus the cell's resistance can be used to distinguish between a "1" and a "0." One important feature of MRAM devices is that they are non-volatile memory devices, since they maintain the information even when the power is off. The two plates can be sub-micron in lateral size and the magnetization direction can still be stable with respect to thermal fluctuations.

FIG. 1A illustrates a magnetic tunnel junction ("MTJ") 130 for a conventional MRAM device. The MTJ 130 includes reference layer 132, which is a magnetic layer, a non-magnetic tunneling barrier layer 134, which generally is an insulator at large layer thickness but at small layer thickness admits the flow of an appreciable quantum mechanical tunnel current, and a free layer 136, which is also a magnetic layer. The magnetization direction of the magnetic layers of the MTJ 130 can be in the planes of those layers or perpendicular to the planes of those layers. As shown in FIG. 1A, the magnetic reference layer 132 has a magnetization direction perpendicular to its plane. Also as seen in FIG. 1A, the free layer 136 also has a magnetization direction perpendicular to its plane, but its direction can vary by 180 degrees. Because the magnetization direction of the magnetic layers of the MTJ 130 is perpendicular to the planes of those layers, the MTJ 130 shown in FIG. 1A is known as a perpendicular MTJ ("pMTJ").

As shown in FIG. 1A, electrical contact layers 170, 172 can optionally be used to provide electrical contact to the MTJ 130. When the magnetization of the free layer 136 is oriented in a direction parallel to the magnetization direction of the reference layer 132, electrons will be more likely to tunnel across the tunneling barrier layer 134, and thus resistance across the MTJ 130 will be lower. Alternatively, when the magnetization of the free layer 136 is oriented in a direction that is anti-parallel to the magnetization direction of the reference layer 132, electrons will be less likely to tunnel across the tunneling barrier layer 134, making the resistance across the MTJ 130 significantly higher. It is these different resistances that can be used to distinguish and store a digital "1" or "0" bit.

The MTJ 130 may also form part of a larger MTJ stack 100, as shown in FIG. 1B, which may include a number of other optional layers that can be used to facilitate operation of the MTJ. As described in connection with FIG. 1A, the MTJ stack 100 of FIG. 1B may include electrical contact layers 170, 172 for providing electrical contact across the MTJ stack 100, including the MTJ 130. The MTJ 130 may be disposed above an antiferromagnetic layer or a synthetic antiferromagnetic ("SAF") structure 120, which may include multiple layers as shown in FIG. 1B. For example, as shown in FIG. 1B, the SAF structure 120 may include two or more thin magnetic layers, including a lower "SAF1" layer 122 and an upper "SAF2" layer 126 having opposite or anti-parallel magnetization directions separated by an anti-ferromagnetic coupling layer 124 or spacer layer that is not magnetic. The SAF structure 120 also may be formed over a seed layer 110, as shown in FIG. 1B, and over a substrate (not shown). Note that as used herein, terms such as "lower," "upper," "top," "bottom," and the like are provided for convenience in explaining the various embodiments, and are not limiting in any way.

Spin transfer torque or spin transfer switching, may be used in connection with an MTJ 130. In such a configuration, a filter layer 150 may be used to alter the spin of electrons passing through the MTJ 130. For example, the filter layer may be a polarizer layer designed to further align the spin of electrons (i.e., to further "polarize" the electrons) passing through the MTJ 130 beyond the alignment already provided by the reference layer 132. U.S. patent application Ser. No. 14/814,036, filed by Pinarbasi et al., and assigned to the assignee of this patent document describes using a polarizer layer. The disclosure of U.S. patent application Ser. No. 14/814,036 is incorporated herein by reference in its entirety. The spin-aligned or "polarized" electrons are used to change the magnetization orientation of the free layer 136 in the MTJ 130. In general, electrons possess a spin, a quantized number of angular momentum intrinsic to the electron. An electrical current is generally unpolarized, i.e., it consists of 50% spin up and 50% spin down electrons. Passing a current though a magnetic layer, like the filter layer 150 or the reference layer 132, polarizes electrons with the spin orientation corresponding to the magnetization direction of the magnetic layer, thus producing a spin-polarized current. If a spin-polarized current is passed to the magnetic region of a free layer 136 of the MTJ 130, the electrons will transfer a portion of their spin-angular momentum to the free layer to produce a torque on the magnetization of the free layer. Thus, this spin transfer torque can switch the magnetization of the free layer, and can be used to write either a "1" or a "0" based on whether the free layer 136 is in the parallel or anti-parallel states relative to the reference layer.

As shown in FIG. 1B, the filter layer 150 and a filter coupling layer 140 are disposed above the free layer 136 of the MTJ 130. The filter layer 150 is physically separated from the free layer 136 and is coupled to the free layer 136 by the coupling layer 140. The filter layer 150 can be used to polarize a current of electrons ("spin-aligned electrons") applied to MTJ structure 100 in the manner described above.

The filter layer 150 is a precessional spin current ("PSC") magnetic layer, an example of which is described in detail in U.S. patent application Ser. No. 14/814,036, filed by Pinarbasi et al., and assigned to the assignee of this patent document. Additionally, a precessional spin current structure for MRAM is described in U.S. patent application Ser. Nos. 15/445,260 and 15/445,362, both of which are filed by Pinarbasi et al. and are assigned to the assignee of this patent document. The disclosures of U.S. patent application Ser. Nos. 15/445,260 and 15/445,362 are both incorporated herein by reference in their entireties.

Switching speed, switching current, and thermal barrier height are all parameters that affect the overall performance of MRAM devices. In such devices, it is desirable to maximize switching speed while minimizing switching current and thermal barrier height. However, a selected value for one of those parameters may limit the possible values for others of those parameters. Thus, tradeoffs between selected values must be made in order to maintain optimal performance. In conventional pMTJ devices, the tradeoff between switching speed, switching current, and thermal barrier height, while important, has been difficult to optimize. Moreover, in conventional pMTJ devices, the filter layer (e.g., precessional spin current layer) has a size and shape that are the same as those of the free layer. For example, in conventional pMTJ devices, the filter layer has a diameter that is the same as a diameter of the free layer. Furthermore, in conventional pMTJ devices, the filter layer and the free layer are formed coaxially with one another. Also, in conventional pMTJ devices, the filter layer has a moment density that is uniform throughout the layer.

SUMMARY

An MRAM device is disclosed that has a precessional spin current layer with a size or a shape that is different from that of the free layer of the pMTJ. The precessional spin current layer may have a center that is offset relative to a center of the free layer, such that the precessional spin current layer and the free layer are not coaxial with one another. The ability to vary the size, shape, or offset of the precessional spin current layer with respect to that of the free layer provides additional degrees of freedom by which the injection of stray fields and the electronic coupling between the precessional spin current and the free layer can be controlled and optimized. Moreover, the off-center design may be used to adjust the location of the stray-field injection in the free layer.

Also disclosed is an MRAM device that has a precessional spin current layer in which a moment density is varied and non-uniform throughout the layer. For example, the moment density of the precessional spin current layer may vary radially over the diameter of the layer. As one example, the moment density at the center of the precessional spin current layer is greater than a moment density at a perimeter of the precessional spin current layer. The use of a precessional spin current layer with a non-uniform moment density provides an additional degree of freedom by which the injection of stray fields and the electronic coupling between the precessional spin current and the free layer can be controlled and optimized. Moreover, the decreased moment density at the perimeter of the precessional spin current layer helps to stabilize the free layer when the effective magnetic field ($B_{eff}$) of the precessional spin current layer is high. In addition, spin accumulation can be increased near the center of the precessional spin current layer, helping to switch the free layer.

In an embodiment, a magnetic device may include a first synthetic antiferromagnetic structure in a first plane having a magnetization vector that is perpendicular to the first plane and having a fixed magnetization direction. An embodiment may also include an antiferromagnetic coupling layer in a second plane and disposed above the first synthetic antiferromagnetic structure and a second synthetic antiferromagnetic structure in a third plane and disposed over the antiferromagnetic coupling layer. An embodiment further includes a magnetic reference layer in a fourth plane and disposed over the second synthetic antiferromagnetic structure. The magnetic reference layer has a magnetization vector that is perpendicular to the fourth plane and has a fixed magnetization direction. (For the purposes of this patent document, angles within several degrees of perpendicular are within the scope of what is considered perpendicular.) An embodiment further includes a non-magnetic tunnel barrier layer in a fifth plane and disposed over the magnetic reference layer. An embodiment also includes a free magnetic layer disposed in a sixth plane over the non-magnetic tunnel barrier layer. The free magnetic layer has a magnetization vector that is perpendicular to the sixth plane and has a magnetization direction that can switch between a first magnetization direction to a second magnetization direction. The magnetic reference layer, the non-magnetic tunnel barrier layer and the free magnetic layer form a magnetic tunnel junction. An embodiment also includes a precessional spin current magnetic layer in a seventh plane that is physically separated from the free magnetic layer and coupled to the free magnetic layer by a filter coupling layer that may induce ferromagnetic or antiferromagnetic coupling between the free magnetic layer and the filter layer.

In an embodiment of the magnetic device, the precessional spin current magnetic layer has a non-uniform moment density.

In an embodiment of the magnetic device, a moment density at a center of the precessional spin current magnetic layer is greater than a moment density at a perimeter of the precessional spin current magnetic layer.

In an embodiment of the magnetic device, the precessional spin current magnetic layer is formed from $Co_xFe_yB_z$, where y is in the range 40% to 70%, z is in the range 18% to 21%, and x+y+z=100%.

In an embodiment of the magnetic device, a percentage of Fe in the first region is greater than a percentage of Fe in the second region.

In an embodiment of the magnetic device, a ratio of the percentage of Fe in the first region to the percentage of Fe in the second region is in the range of 1.15 to 1.75.

In an embodiment of the magnetic device, the second region is formed from $Co_xFe_yB_z$, where y is in the range 40% to 70%, z is in the range 18% to 21%, and x+y+z=100%, and wherein the first region is formed from Fe.

In an embodiment of the magnetic device, the second region is formed from $Co_xFe_yB_z$, where y is in the range 40% to 70%, z is in the range 18% to 21%, and x+y+z=100%, and wherein the first region is formed from FeCo.

In an embodiment of the magnetic device, the magnetic device includes a first central region and a plurality of annular regions disposed around the central region, each annular region having a moment density that is less than a moment density of each region disposed therein.

In an embodiment of the magnetic device, a percentage of Fe in the each annular region is less than a percentage of Fe in each region disposed therein.

BRIEF DESCRIPTION OF THE DRAWINGS

The accompanying drawings, which are included as part of the present specification, illustrate the presently preferred embodiments and, together with the general description given above and the detailed description given below, serve to explain and teach the principles of the MTJ devices described herein.

FIG. 1A illustrates a conventional MTJ capable of use in an MRAM device.

FIG. 1B illustrates a conventional MTJ stack for an MRAM device.

FIG. 3A illustrates an MTJ stack for an MRAM device with a precessional spin current layer having a central axis that is offset from a central axis of the free layer.

FIG. 3B illustrates a circular precessional spin current layer of an MTJ stack for an MRAM device, the precessional spin current layer having a central axis that is offset from a central axis of the free layer.

FIG. 3C illustrates a non-circular precessional spin current layer of an MTJ stack for an MRAM device, the precessional spin current layer having a central axis that is offset from a central axis of the free layer.

FIG. 4A illustrates an MTJ stack for an MRAM device with a precessional spin current layer having a non-uniform moment density.

FIG. 4B illustrates a precessional spin current layer of an MTJ stack for an MRAM device, the precessional spin current layer having a non-uniform moment density.

FIG. 5A illustrates an MTJ stack for an MRAM device with a precessional spin current layer having a sequence of regions with varying moment densities.

FIG. 5B illustrates a precessional spin current layer of an MTJ stack for an MRAM device, the precessional spin current layer having a sequence of regions with varying moment densities.

Figure 2B:
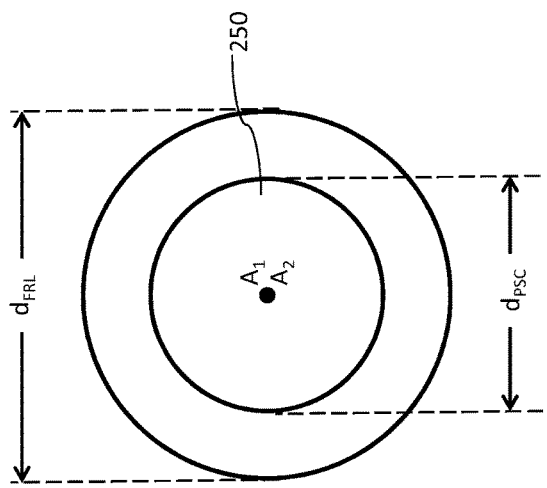
FIG. 2B illustrates a precessional spin current layer of an MTJ stack for an MRAM device, the precessional spin current layer having a diameter that is different from a diameter of the free layer.

The figures are not necessarily drawn to scale and the elements of similar structures or functions are generally represented by like reference numerals for illustrative purposes throughout the figures. The figures are only intended to facilitate the description of the various embodiments described herein; the figures do not describe every aspect of the teachings disclosed herein and do not limit the scope of the claims.

DETAILED DESCRIPTION

The following description is presented to enable any person skilled in the art to create and use a precessional spin current structure for a pMTJ device that provides switching and stability control for the device. Each of the features and teachings disclosed herein can be utilized separately or in conjunction with other features to implement the disclosed system and method. Representative examples utilizing many of these additional features and teachings, both separately and in combination, are described in further detail with reference to the attached drawings. This detailed description is merely intended to teach a person of skill in the art further details for practicing preferred aspects of the present teachings and is not intended to limit the scope of the claims. Therefore, combinations of features disclosed in the following detailed description may not be necessary to practice the teachings in the broadest sense, and are instead taught merely to describe particularly representative examples of the present teachings.

In the following description, for purposes of explanation only, specific nomenclature is set forth to provide a thorough understanding of the present teachings. However, it will be apparent to one skilled in the art that these specific details are not required to practice the present teachings.

This patent document discloses a precessional spin current structure for a pMTJ device that provides switching and stability control for the device. For example, by designing a precessional spin current structure in accordance with this patent document, additional control of the injection of stray fields and the electronic coupling between the precessional spin current layer and the pMTJ can be achieved. In addition, this patent document provides disclosures for how switching speed, switching current, and thermal barrier height can be adjusted in an MRAM device thereby providing advantages to commercial applications of said pMTJ devices.

According to embodiments, a precessional spin current layer may have a size that is different than that of a free layer. For example, a precessional spin current layer may have a diameter that is less than a diameter of the free layer. In some embodiments, a precessional spin current layer may be coaxial with a free layer. In other embodiments, a precessional spin layer may be offset (i.e., not coaxial) from the free layer. In some embodiments, a precessional spin current layer may have a shape that is the same as that of the free layer, and may have, for example, a circular shape. In other embodiments, a precessional spin current layer may have a shape that is not the same as that of the free layer, and may form, for example, a crescent shape. In some embodiments, a moment density of a precessional spin current layer may be uniform. In other embodiments, a moment density may be non-uniform and may vary throughout a precessional spin current layer. For example, a precessional spin current layer may have a moment density at its center that is greater than a moment density at its perimeter.

Figure 2A:
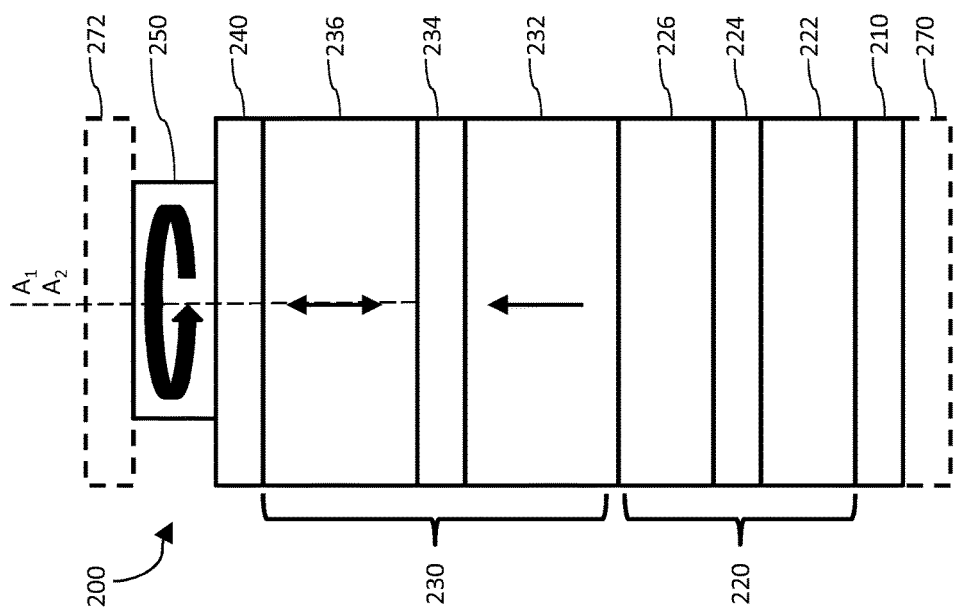
FIG. 2A illustrates an MTJ stack for an MRAM device with a precessional spin current layer having a diameter that is different from a diameter of the free layer.

FIG. 2A shows an MTJ stack 200 that can be used as an MRAM device. The MTJ stack 200 includes an MTJ 230, which includes which includes a magnetic reference layer 232, a non-magnetic tunneling barrier layer 234, and a magnetic free layer 236. The magnetic reference layer 232 has a magnetization direction perpendicular to its plane, and the free layer 236 also has a magnetization direction perpendicular to its plane, but as shown in FIG. 2A, its direction can vary by 180 degrees. The differences in resistance based on whether the magnetization direction of the free layer 236 is parallel to or anti-parallel to the magnetization direction of the reference layer 232 can be used to distinguish and store a digital "1" or "0" bit. The non-magnetic tunneling barrier layer 234 may be formed from MgO, or other suitable material. In embodiments where MgO is used to form the tunneling barrier layer 234, that material may have a crystalline texture that is a (001) texture.

The MTJ stack 200 may also include a number of other optional layers that can be used to facilitate operation of the MTJ 230. For example, the MTJ stack 200 may include electrical contact layers 270, 272 for providing electrical contact across the MTJ stack 200. According to an embodiment, the electrical contact layers 270, 272 may be electrodes for providing a voltage across the MTJ stack 200, and may be formed from any suitable conducting material. The MTJ 230 also can be disposed above an SAF structure 220, which may include multiple sub-layers and structures as shown in FIG. 2A. For example, as shown in FIG. 2A, the SAF structure 220 may include two or more thin magnetic layers, such as a lower "SAF1" layer 222 and an upper "SAF2" layer 226, having opposite or anti-parallel magnetization directions separated by an antiferromagnetic coupling layer 224 (or "spacer" layer) that is not magnetic. The SAF structure 220 also may be formed over a seed layer 210 and over a substrate (not shown). In general, in each of the MTJ stacks described herein, the lower SAF1 layer of the MTJ can be formed on a seed layer, as shown in FIG. 2A and the other figures using similar numbering, and all layers can be formed on a substrate (not shown in the figures). Magnetic layers of the stack 200, such as reference layer 232, the free layer 236, and the magnetic SAF layers 222, 226, may be made from a variety of materials, including Co, Ni, Fe, or alloys of those elements. In addition, magnetic layers of the stack 200 may be made from alloys of magnetic elements with non-magnetic elements, such as B, Ta, W, Pt, and Pd. Additionally, magnetic layers of the stack 200 may also be made using multiple layers of magnetic elements or alloys and non-magnetic elements such as Pt and Pd, including, for example, CoPt or CoPd multi-layers. The antiferromagnetic coupling layer 224 may be made from materials such as Ru or Cr, or other materials suitable to induce anti-parallel alignment between the lower SAF1 layer 222 and the upper SAF2 layer 226.

The MTJ stack 200 includes a precessional spin current layer 250 for facilitating spin transfer torque switching between states. The precessional spin current layer enhances the alignment of the spin of electrons passing through the MTJ 230. The precessional spin current layer 250 and a filter coupling layer 240 disposed above the free layer 236 of the MTJ 230. The precessional spin current layer 250 may be made from materials such as $Co_xFe_yB_z$, which contains x-percent Co, y-percent Fe, and z-percent B, where y is in the range of 40% to 70%, z is in the range of 18% to 21%, and x+y+z=100%. For example, according to an embodiment, the filter layer 250 may be made from $Co_{40}Fe_{40}B_{20}$. The filter coupling layer 240 can be made of MgO, Cr, Ta, TaN, or other suitable materials to permit it to align the spin of electrons passing through the MTJ 230.

The MTJ stack 200 may be designed to reduce stray magnetic fields generated by magnetic layers of the stack 200, thereby increasing the electrical and retention performance of the stack 200 by reducing switching asymmetry in the free layer 236 and by reducing asymmetry in the dynamic magnetic rotation of the precessional spin current layer 250. U.S. patent application Ser. No. 15/634,629, filed by Schabes et al., and assigned to the assignee of this patent document describes techniques for reducing stray magnetic fields, including techniques for depositing an SAF structure and for the use of one or more auxiliary exchange coupling layers in an MTJ stack. The disclosure of U.S. patent application Ser. No. 15/634,629 is incorporated herein by reference in its entirety.

The thickness of the layers of the MTJ stack 200 can vary, and can be adjusted to produce the appropriate or desired electrical performance. Examples of thickness that may be used in certain circumstances are provided. It will be understood by those skilled in the art that these numbers can be adjusted or scaled consistent with the principles described herein. By way of example, the reference layer 232 may have a thickness in the range of 0.5 nanometers ("nm") to 3.0 nm, the free layer 236 may have a thickness in the range of 0.6 nm to 3.0 nm, and the tunnel barrier layer 234 may have a thickness in the range of 0.3 nm to 1.5 nm. By way of example, the lower and upper SAF layers 222, 226 may have a thickness in the range of 1 nm to 15 nm, and the antiferromagnetic coupling layer 224 may have a thickness in the range of 0.5 nm to 1.2 nm. For example, according to embodiments, the SAF layers 222, 226 can have a thickness of 6 nm. The precessional spin current layer 250 may have a thickness in the range from 0.5 nm to 4.5 nm and the filter coupling layer 240 may have a thickness in the range from 0.2 nm to 1.5 nm.

Other dimensions of the layers of the MTJ stack 200 can also be adjusted, as appropriate, to improve electrical performance or to optimize physical characteristics of the MTJ stack 200. As shown in FIGS. 2A and 2B, the precessional spin current layer 250 may have a diameter that is different from a diameter of the free layer 236. For example, use of a precessional spin current layer 250 with a diameter that is less than a diameter of the free layer 360 allows for further control over the switching and stability of the MTJ 230. According to an embodiment, the free layer 236 has a diameter $d_{FRL}$ that is in the range of 5 nm to 100 nm (i.e., 5 nm≤$d_{FRL}$≤100 nm). In that embodiment the precessional spin current layer 250 has a diameter $d_{PSC}$ that is selected such that the ratio of the diameter $d_{PSC}$ of the precessional spin current layer 250 to the diameter $d_{FRL}$ of the free layer 236 is in the range of 0.2 to 0.9, provided the diameter $d_{PSC}$ of the precessional spin current layer 250 is greater than a minimum diameter of 3 nm (i.e., 0.2≤$d_{PSC}/d_{FRL}$≤0.9, if $d_{PSC}$≥3 nm; otherwise $d_{PSC}$=3 nm).

According to an embodiment, the precessional spin current layer 250 is provided such that it is coaxial with the free layer 236. As shown in FIGS. 2A and 2B, the precessional spin current layer 256 has a central axis $A_1$ that is the same as a central axis $A_2$ of the free layer 236.

FIG. 3A shows an MTJ stack 300 that can be used as an MRAM device. The MTJ stack 300 includes an MTJ 330, which includes a magnetic reference layer 332, a non-magnetic tunneling barrier layer 334, and a magnetic free layer 336. The MTJ stack 300 may also include an electrical contact layers 370, 372, an SAF structure 320, which may include a lower SAF1 layer 322, an upper SAF2 layer 326, and a nonmagnetic antiferromagnetic coupling layer 324 therebetween. The SAF structure 320 also may be formed over a seed layer 310 and over a substrate (not shown). The MTJ stack 300 further includes a precessional spin current layer 350 and a filter coupling layer 340 are disposed above the free layer 336 of the MTJ 330. The layers shown in FIG. 3A may have dimensions and may be formed of materials in accordance with the dimensions and materials discussed above with respect to corresponding layers shown in FIG. 2A. Similarly, the purpose served by each layer shown in FIG. 3A is in accordance with the purposes discussed above with respect to each corresponding layer shown in FIG. 2A.

In the embodiment illustrated in FIGS. 3A, 3B, and 3C the precessional spin current layer 350 is provided such that it is axially offset from the free layer 336 by a distance dx. As shown in FIGS. 3A, 3B, and 3C the precessional spin current layer 350 has a central axis $A_3$ that is different from a central axis $A_4$ of the free layer 336. According to an embodiment, the ratio of the offset distance dx to a diameter $d_{FRL}$ of the free layer 336 is in the range of 0 to 0.4 (i.e., $0 \leq dx/d_{FRL} \leq 0.4$). The offset between the precessional spin current layer 350 and the free layer 336 provides an additional degree of freedom by which switching and stability of the MTJ 330 may be controlled. In addition, the offset design can be used to adjust the location of the stray-field injection in the free layer 336.

As illustrated in FIG. 3B, the precessional spin current layer 350 may have a circular shape. FIG. 3C illustrates an embodiment in which the precessional spin current layer 350 has a non-circular shape. In that embodiment, the profile of the precessional spin current layer 350 over the free layer 356 forms a crescent shape. Such a shape can be achieved, for example, by forming a precessional spin current layer 350 with a portion that overhangs the free layer 336 and etching away the overhanging portion during manufacture of the MTJ stack 300.

FIG. 4A shows an MTJ stack 400 that can be used as an MRAM device. The MTJ stack 400 includes an MTJ 430, which includes a magnetic reference layer 432, a non-magnetic tunneling barrier layer 434, and a magnetic free layer 436. The MTJ stack 400 may also include an electrical contact layers 470, 472, an SAF structure 420, which may include a lower SAF1 layer 422, an upper SAF2 layer 426, and a nonmagnetic antiferromagnetic coupling layer 424 therebetween. The SAF structure 420 also may be formed over a seed layer 410 and over a substrate (not shown). The MTJ stack 400 further includes a precessional spin current layer 450 and a filter coupling layer 440 are disposed above the free layer 436 of the MTJ 430. The layers shown in FIG. 4A may have dimensions and may be formed of materials in accordance with the dimensions and materials discussed above with respect to corresponding layers shown in FIGS. 2A and 3A. Similarly, the purpose served by each layer shown in FIG. 4A is in accordance with the purposes discussed above with respect to each of the corresponding layers shown in FIGS. 2A and 3A.

In the embodiment illustrated in FIGS. 4A and 4B, the precessional spin current layer 450 has a center with a moment density that is different from a moment density at a perimeter of the precessional spin current layer 450. For example, the precessional spin current layer may include a first region 452 having a high moment density and a second region 454 having a relatively low moment density. According to an embodiment, the materials for the first region 452 having the high moment density and the second region 454 having the low moment density are both alloys of the type $Co_xFe_yB_z$, which contains x-percent Co, y-percent Fe, and z-percent B, where y is in the range of 40% to 70%, z is in the range of 18% to 21%, and x+y+z=100%. According to that embodiment, the percentage of Fe $y_{HDR}$ in the high moment density region 452 is relatively higher compared to the percentage of Fe $y_{LDR}$ in the low moment density region 454, and the ratio of the percentage of Fe $y_{HDR}$ in the high moment density region 452 to the percentage of Fe $y_{LDR}$ in the low moment density region 454 is in the range of 1.15 to 1.75 (i.e., $1.15 \leq y_{HDR}/y_{LDR} \leq 1.75$). According to another embodiment, the material for the low moment density region 454 is an alloy of the type $Co_xFe_yB_z$, which contains x-percent Co, y-percent Fe, and z-percent B, where y is in the range of 40% to 70%, z is in the range of 18% to 21%, and x+y+z=100%, and the material for the high moment density region 452 is Fe. According to another embodiment, the material for the high moment density region 452 is FeCo.

According to an embodiment, a distinct boundary may exist between the high moment density region 452 and the low moment density region 454. For example, the boundary between the high moment density region 452 and the low moment density region 454 may resemble a step function. According to another embodiment, a less distinct boundary may exist between the high moment density region 452 and the low moment density region 454. For example, the boundary between the high moment density region 452 and the low moment density region 454 may resemble a Gaussian, super-Gaussian, or other desirable function. In such embodiments, a high temperature diffusion process may be used to induce diffusive processes for smoothing out the chemical concentration profiles of the high moment density region 452 and the low moment density region 454.

Providing a precessional spin current layer 450 having a non-uniform moment density allows for further control over the switching and stability of the MTJ 430. In addition, the reduction of the moment density of the precessional spin current layer 450 at its perimeter helps stabilize the free layer 430 when the effective magnetic field of the precessional spin current layer 450 is high. Furthermore, spin accumulation can be increased near the center of the precessional spin current layer 450, helping to switch the free layer 436.

FIG. 5A shows an MTJ stack 500 that can be used as an MRAM device. The MTJ stack 500 includes an MTJ 530, which includes which includes a magnetic reference layer 532, a non-magnetic tunneling barrier layer 534, and a magnetic free layer 536. The MTJ stack 500 may also include an electrical contact layers 570, 572, an SAF structure 520, which may include a lower SAF1 layer 522, an upper SAF2 layer 526, and a nonmagnetic antiferromagnetic coupling layer 524 therebetween. The SAF structure 520 also may be formed over a seed layer 510 and over a substrate (not shown). The MTJ stack 500 further includes a precessional spin current layer 550 and a filter coupling layer 540 are disposed above the free layer 536 of the MTJ 530. The layers shown in FIG. 5A may have dimensions and may be formed of materials in accordance with the dimensions and materials discussed above with respect to corresponding layers shown in FIGS. 2A, 3A, and 4A. Similarly, the purpose served by each layer shown in FIG. 5A is in accordance with the purposes discussed above with respect to each of the corresponding layers shown in FIGS. 2A, 3A, and 4A.

Similar to the embodiment illustrated in FIGS. 4A and 4B, in the embodiment illustrated in FIGS. 5A and 5B, the precessional spin current layer 550 has a center with a moment density that is different from a moment density at a perimeter of the precessional spin current layer 550. In the embodiment illustrated in FIGS. 5A and 5B, the precessional spin current layer 550 has a sequence of annular regions, each region having a progressively lower moment density when moving from a center of the precessional spin current layer 550 to a perimeter of the precessional spin current layer 550. For example, the precessional spin current layer 550 may include a first region 552 having a high moment density, a second region 554 having a relatively low moment density compared to the first region 552, and a third region 556 having a relatively low moment density compared to the second region 554. According to embodiments, the materials for the first region 552, the second region 554, and the third region 556 may include one or more combinations of the materials described above with respect to the precessional spin current layer 450 shown in FIGS. 4A and 4B. According to those embodiments, the percentage of Fe in the first region is greater than the percentage of Fe in the second region, which is greater than the percentage of Fe in the third region. According to embodiments, the precessional spin current layer 550 may include four or more regions having varying moment densities. The number of annular regions with different moment densities may be increased or decreased to accomplish the desired profile and performance.

The process by which the precessional spin current layer 450 of FIGS. 4A and 4B is formed may be applied iteratively to form the precessional spin current layer of FIGS. 5A and 5B. According to an embodiment, distinct boundaries may exist between the several regions 552, 554, 556 of the precessional spin current layer 550. For example, the boundaries between the several regions 552, 554, 556 may resemble step functions. According to another embodiment, less distinct boundaries may exist between the several regions 552, 554, 556 of the precessional spin current layer 550. For example, the boundaries between the several regions 552, 554, 556 may resemble Gaussian, super-Gaussian, or other desirable functions. In such embodiments, a high temperature diffusion process may be used to induce diffusive processes for smoothing out the chemical concentration profiles of the several regions 552, 554, 556. Alternatively, according to embodiments, a larger number of annular regions each having a progressively changing magnetic moment density to accomplish the desired profile and control.

Figure 6:
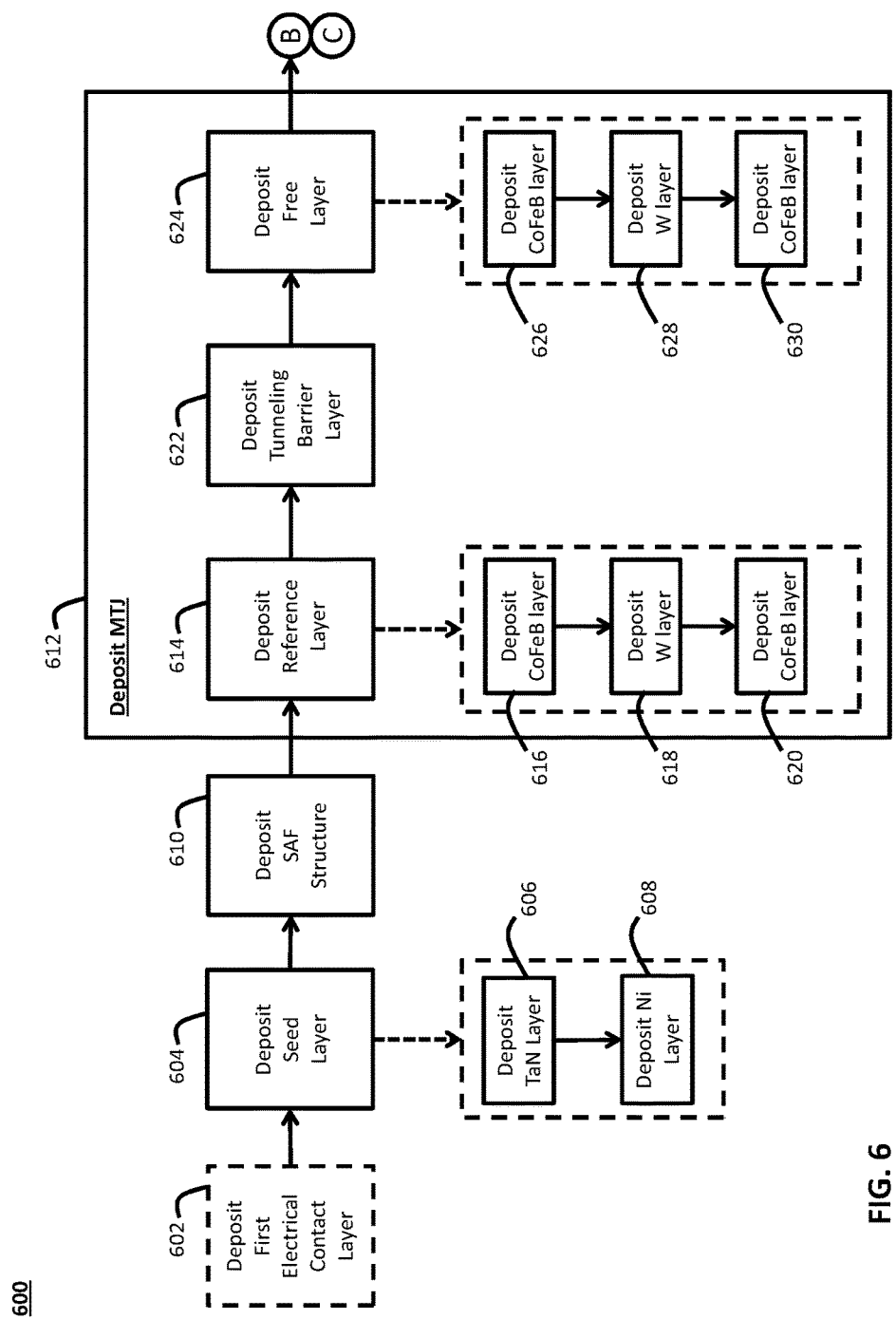
FIG. 6 illustrate flow charts showing manufacturing steps for an MRAM device in accordance with embodiments.

A flowchart showing a method 600 of manufacturing an embodiment of an MRAM stack, according to an embodiment, is illustrated in FIG. 6. The method 600 shown in FIG. 6 can be used to manufacture the MRAM stacks 200, 300, 400, 500 described in connection with FIGS. 2-5. Accordingly, to the extent that reference is made to MRAM stacks and the layers thereof, it is meant to be inclusive of the MTJ stacks 200, 300, 400, 500 of those figures and the other MTJ stacks described herein, and is not intended to be exclusive, even if reference is made to only one or a subset of the MTJ stacks in those figures.

The method 600 shown in FIG. 6 details how the MRAM stack is formed on a substrate, which in an embodiment can be a silicon substrate and in other embodiments can be any other appropriate substrate material. Optionally, at optional step 602, an optional first electrical contact layer 270, 370, 470, 570 may be deposited. The first electrical contact layer is made from electrically conductive material, such as Cu, Au, or another suitable conductor, and may be used as a bottom electrode to apply a voltage across the MTJ stack.

In step 604 seed layer 210, 310, 410, 510 is deposited. In an embodiment, the seed layer can be constructed by depositing, at step 606, a TaN layer and then, at step 608, depositing a Ni layer, which together form the seed layer. In an embodiment, the TaN layer is a thin film having a thickness of 5 nm and the Ni layer is a thin film having a thickness of 5 nm. In alternative embodiments, the TaN layer can have a thickness ranging from 2 nm to 20 nm while Ni layer can have a thickness ranging from 0 nm to 20 nm. According to an embodiment, the Ni layer can be replaced by a Cu layer or a layer made of other suitable materials.

At step 610, an SAF structure 220, 320, 420, 520 is deposited. As described herein, the SAF structure is a multi-layer structure that generally includes two or more thin magnetic layers having opposite or anti-parallel magnetization directions, which are separated by an antiferromagnetic coupling layer or spacer layer that is not magnetic. According to embodiments, the SAF structure is created in such a way to reduce stray magnetic fields by creating an imbalance in the total magnetic moment above and below the antiferromagnetic coupling layer. That imbalance can be created by adding auxiliary layers to the stack, or by adjusting the thickness and magnetic moment density of one or more layers of the SAF structure. U.S. patent application Ser. No. 15/634,629, referenced and incorporated by reference above, describes detailed methods for forming an SAF structure, including one or more auxiliary layers.

After deposition of the SAF structure in step 610, a magnetic tunnel junction ("MTJ") 230, 330, 430, 530 is deposited over the SAF structure in step 612. The MTJ includes multiple layers and is deposited in several steps, as shown in FIG. 6.

As part of the manufacture of the MTJ (step 612), in step 614, a reference layer 232, 332, 432, 532 is deposited. According to an embodiment, fabricating the reference layer includes several steps, including deposition of magnetic layer in step 616, deposition of a tungsten (W) layer in step 618, and deposition of another magnetic layer in step 620. In an embodiment, the magnetic layer deposited in step 616 comprises a thin film of CoFeB having a thickness of 0.6 nm, where the alloy is sixty (60) percent Fe, twenty (20) percent Co and twenty (20) percent B. In an embodiment, the W layer deposited in step 618 comprises a thin film of W having a thickness of 0.2 nm. In an embodiment, the magnetic layer deposited in step 620 comprises a thin film of CoFeB having a thickness of 0.8 nm, where the alloy is sixty (60) percent Fe, twenty (20) percent Co and twenty (20) percent B. In other embodiments, the magnetic layer deposited in step 616 can comprise a thin film of CoFeB having a thickness ranging from 0.5 nm to 1.0 nm, the W layer deposited in step 618 can comprise a thin film having a thickness of 0.1 nm to 1.0 nm, and the magnetic layer deposited in step 620 can comprise a thin film of CoFeB having a thickness of 0.5 nm to 2.0 nm. The reference layer of the MTJ is constructed using magnetic materials so that it has a magnetic vector having a magnetic direction perpendicular to its plane, is fixed in direction. According to an embodiment, the magnetic direction of the reference layer is antiparallel to the magnetic direction of the lower SAF1 layer of the SAF structure.

As part of the manufacture of the MTJ (step 612), at step 622, non-magnetic tunneling barrier layer 234, 334, 434, 534 is deposited on the reference layer. In an embodiment, the non-magnetic tunneling barrier is formed as a thin film of an insulating material, such as MgO.

The manufacture of the MTJ (step 612) continues at step 624, when a free layer 236, 336, 436, 536 is deposited over the non-magnetic tunneling barrier layer. According to an embodiment, the free layer is made from magnetic materials. Fabrication of free layer includes several steps. At step 626, a magnetic layer is deposited over non-magnetic tunneling barrier layer. In an embodiment, the magnetic layer deposited in step 626 is comprised of a thin film of CoFeB having a thickness of 1.2 nm, where the alloy is sixty (60) percent Fe, twenty (20) percent Co and twenty (20) percent B. In other embodiments, magnetic layer deposited in step 626 can comprise a thin film of CoFeB or other suitable magnetic material having a thickness ranging from 0.5 nm to 2.0 nm. Manufacture of free layer continues at step 628, where a Tungsten (W) layer is deposited over the magnetic layer deposited in step 626. In an embodiment, the W layer comprises a thin film of W having a thickness of 0.2 nm, and in other embodiments can a thickness ranging from 0.1 nm to 1.0 nm. At step 630, manufacture of the free layer continues when a second magnetic layer is deposited over the W layer deposited in step 628. In an embodiment, the second magnetic layer of the free layer deposited in step 630 can comprise a thin film of CoFeB having a thickness of 0.9 nm, where the alloy is sixty (60) percent Fe, twenty (20) percent Co and twenty (20) percent B. In other embodiments, the second magnetic layer deposited in step 630 can comprise a thin film of CoFeB or other suitable magnetic material having a thickness ranging from 0.5 nm to 1.5 nm.

Collectively, the first and second magnetic layers deposited in steps 626 and 630, along with non-magnetic W layer deposited in step 628, form the free layer formed in step 624. The free magnetic layer has a magnetic vector having a magnetic direction substantially perpendicular to its plane. Although the magnetic direction of the free magnetic layer is substantially perpendicular to its plane, it may also include magnetization pointing a few degrees away from the perpendicular axis. The tilted angle of the free layer magnetization can be due to interaction with a filter layer, such as a precessional spin current magnetic layer, described herein, or due to magnetocrystalline anisotropy, and can help switching of the free layer magnetization by improving the initiation of the switching. The magnetic direction of free layer can switch one hundred eighty (180) degrees from one direction to another, antiparallel, direction.

Figure 7:
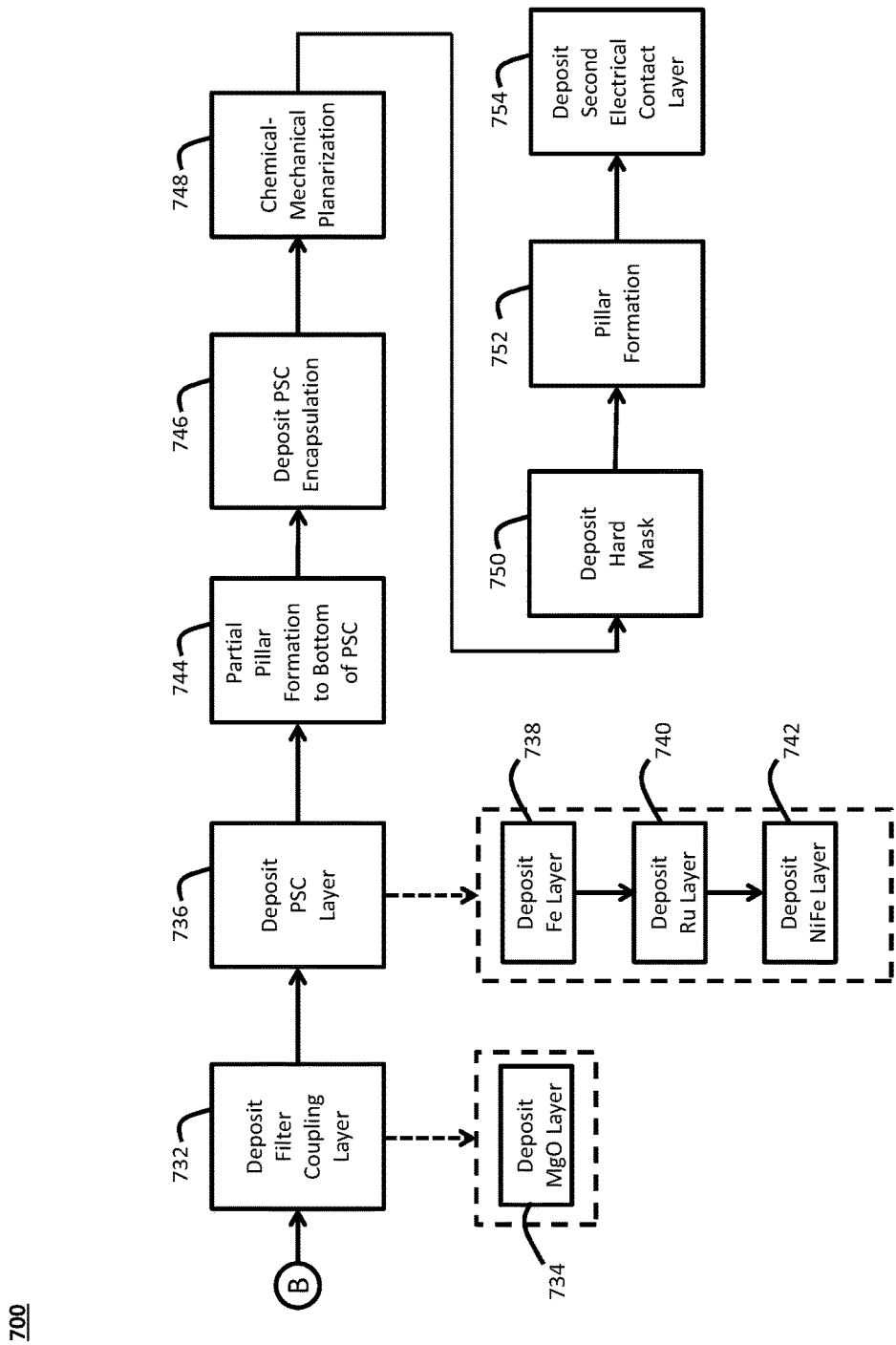
FIG. 7 illustrate flow charts showing manufacturing steps for an MRAM device in accordance with embodiments.

According to embodiments, including those shown and described in connection with FIGS. 2A, 2B, 3A, 3B, and 3C, after fabrication of MTJ at step 612, process 600 is continued as process 700 in FIG. 7 at step 732. In step 732, a filter coupling layer 240, 340 is deposited over the MTJ. In an embodiment, the spacer deposited in step 732 can comprise a thin film of MgO (as shown in step 734) having a thickness of 0.8 nm. In other embodiments, the spacer can comprise a thin film of MgO having a thickness ranging from 0.5 nm to 1.5 nm. In other embodiments, the spacer can be constructed as described in U.S. patent application Ser. No. 14/866,359, filed Sep. 25, 2015, and entitled "Spin Transfer Torque Structure For MRAM Devices Having A Spin Current Injection Capping Layer." U.S. patent application Ser. No. 14/866,359 is hereby incorporated by reference in its entirety.

After deposition of spacer layer in step 732, a precessional spin current layer 250, 350 is deposited in step 736. As shown in FIG. 7, the manufacture of the precessional spin current layer can comprise several steps. At step 738, a magnetic Fe layer is fabricated over the filter coupling layer deposited in step 732. In an embodiment, the magnetic Fe layer comprises a thin film of Fe having a thickness of 0.6 nm. In other embodiments, magnetic Fe layer deposited in step 738 can comprise a thin film of Fe having a thickness ranging from 0.5 nm to 2.0 nm. At step 740, a Ru layer is deposited over the magnetic Fe layer. In an embodiment, Ru layer deposited in step 740 can comprise a thin film of Ru having a thickness of 1.5 nm, and in other embodiments can comprise a thin film of Ru having a thickness ranging from 0.4 nm to 5.0 nm. At step 742, a magnetic NiFe layer is deposited. In an embodiment, magnetic NiFe layer comprises eighty (80) percent Ni and twenty (20) percent Fe, and has a thickness of 3.0 nm. In other embodiments, the NiFe layer can have a thickness ranging between 0.5 nm to 7.0 nm. NiFe layer can also comprise multiple layers, such as a thin film of CoFeB and NiFe according to an embodiment, or a NiFe layer in between layers of CoFeB, according to another embodiment.

After manufacture of precessional spin current layer 250, 350, partial pillar formation takes place in step 744. Partial pillar formation affects the precessional spin current layer 250, 350, but stops at the filter coupling layer 240, 340. In forming a partial pillar in step 744, the size and location of the precessional spin current layer 250, 350 may be determined. In particular, the precessional spin current layer 250, 350 may be formed such that its diameter will be less than a diameter of the free layer 236, 336, as shown in FIGS. 2A, 2B, 3A, 3B, and 3C. Furthermore, the precessional spin current layer 350 may be formed such that a central axis of the precessional spin current layer 350 will be offset from a central axis of the free layer 336, as shown in FIGS. 3A, 3B, and 3C.

In step 746, the precessional spin current layer 250, 350 is encapsulated by depositing a suitable insulating material such as alumina ($Al_2O_3$). In Step 748, a chemical-mechanical planarization (CMP) process is used to bring the top of the encapsulating material to the level of the top of the precessional spin current layer 250, 350.

In step 750, a hard mask layer is deposited. In step 752, a pillar is formed, resulting in formation of the MTJ stack 200, 300. In step 754, the second electrical contact layer 272, 372 is deposited above the newly-formed precessional spin current layer 250, 350. Following step 754, the MTJ stack 200, 300 is of the form illustrated and described in connection with FIG. 2A or FIG. 3A.

Figure 8:
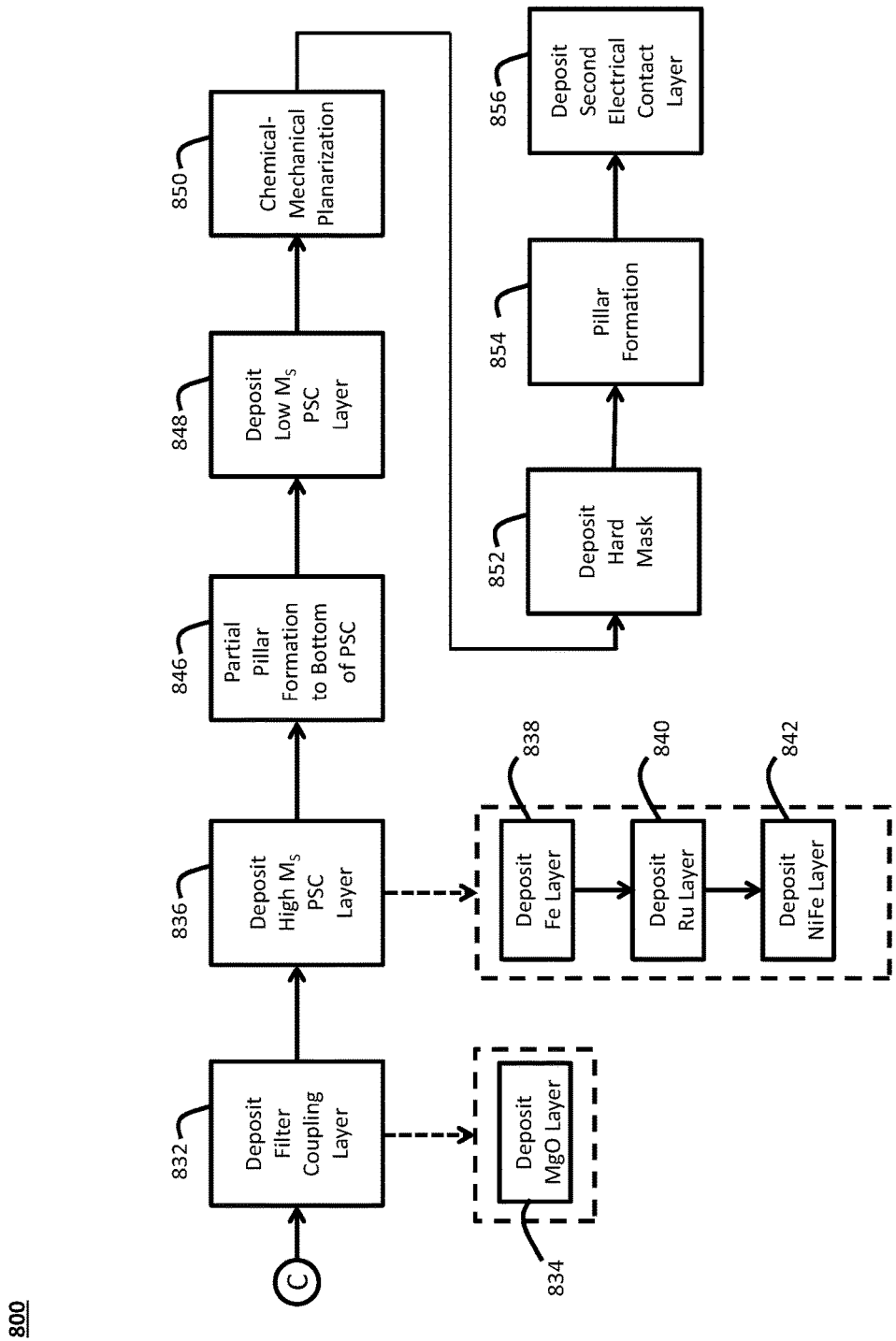
FIG. 8 illustrates a flow chart showing manufacturing steps for an MRAM device in accordance with embodiments.

According to embodiments, including those shown and described in connection with FIGS. 4A, 4B, 5A and 5B, after fabrication of MTJ at step 612, process 600 is continued as process 800 in FIG. 8 at step 832. In step 732, a filter coupling layer 440, 540 is deposited over the MTJ in a manner similar to that described above with respect to step 732. Step 832 may include a step 834 for depositing a layer of MgO, similar to step 734.

After deposition of spacer layer in step 832, a precessional spin current layer 450, 550 is deposited in step 836. Deposition of the precessional spin current layer 450, 550 in step 836 proceeds in a manner similar to that described above with respect to step 736, provided that the material used to form the precessional spin current layer 450, 550 has a relatively high moment density. Step 836 may include steps 838, 840, and 842, for depositing Fe, Ru, and NiFe layers, as described in connection with steps 738, 740, and 742, respectively.

After deposition of the precessional spin current layer 450, 550, partial pillar formation takes place in step 846. Partial pillar formation affects the precessional spin current layer 450, 550, but stops at the filter coupling layer 440, 540. In forming a partial pillar in step 846, the size and location of the high moment density region 452, 552 of the precessional spin current layer 450, 550 may be determined. In particular, the high moment density region 452, 552 may be formed such that its diameter will be less than a diameter of the free layer 436, 536, as shown in FIGS. 4A, 4B, 5A, and 5B.

In step 848, additional material for the precessional spin current layer 450, 550 is deposited in a manner similar to that described above with respect to step 836 except that, in step 848, the additional material used to form the remaining portion of the precessional spin current layer 450, 550 has a moment density that is relatively low compared to that of the material used in step 836. According to an embodiment, steps 846 and 848 may be iterated to form a sequence of annular regions, each region having a progressively lower moment density when moving from a center of the precessional spin current layer 550 to a perimeter of the precessional spin current layer 550 as shown in FIGS. 5A and 5B.

In step 850, a chemical-mechanical planarization (CMP) step may be performed, stopping at the precessional spin current layer 450, 550. In step 852, a hard mask layer is deposited. In step 854, a pillar is formed, resulting in formation of the MTJ stack 400, 500. In step 856, a second electrical contact layer 472, 572 is deposited above the newly-formed precessional spin current layer 450, 550. Following step 856, the MTJ stack 400, 500 is of the form illustrated in FIG. 4A or FIG. 5A.

All of the layers of the MRAM devices 200, 300, 400, 500 illustrated in FIGS. 2-5 can be formed by a thin film sputter deposition system as would be appreciated by those skilled in such deposition techniques. The thin film sputter deposition system can include the necessary physical vapor deposition (PVD) chambers, each having one or more targets, an oxidation chamber and a sputter etching chamber. Typically, the sputter deposition process involves a sputter gas (e.g., argon, krypton, xenon, or the like) with an ultra-high vacuum and the targets can be made of the metal or metal alloys to be deposited on the substrate. Thus, when the present specification states that a layer is placed over another layer, such layer could have been deposited using such a system. Other methods can be used as well. It should be appreciated that the remaining steps necessary to manufacture MTJ stacks 200, 300, 400, 500 are well-known to those skilled in the art and will not be described in detail herein so as not to unnecessarily obscure aspects of the disclosure herein.

It should be appreciated to one skilled in the art that a plurality of MTJ structures 200, 300, 400, 500 can be manufactured and provided as respective bit cells of an STT-MRAM device. In other words, each MTJ stack 200, 300, 400, 500 can be implemented as a bit cell for a memory array having a plurality of bit cells.

It should be recognized that certain components or elements of the embodiments described above, or in the claims that follow, are numbered to allow ease of reference to them or to help distinguish between them, but order should not be implied from such numbering, unless such order is expressly recited. The above description and drawings are only to be considered illustrative of specific embodiments, which achieve the features and advantages described herein. Modifications and substitutions to specific process conditions can be made. Accordingly, the embodiments in this patent document are not considered as being limited by the foregoing description and drawings.

What is claimed is:

1. A magnetic device, comprising:
a first synthetic antiferromagnetic structure in a first plane having a magnetization vector that is perpendicular to the first plane and having a fixed magnetization direction;
an antiferromagnetic coupling layer in a second plane and disposed above the first synthetic antiferromagnetic structure;
a second synthetic antiferromagnetic structure in a third plane and disposed over the antiferromagnetic coupling layer;
a magnetic reference layer in a fourth plane and disposed over the second synthetic antiferromagnetic structure, the magnetic reference layer having a magnetization vector that is perpendicular to the fourth plane and having a fixed magnetization direction;
a non-magnetic tunnel barrier layer in a fifth plane and disposed over the magnetic reference layer;
a free magnetic layer disposed in a sixth plane over the non-magnetic tunnel barrier layer, the free magnetic layer having a magnetization vector that is perpendicular to the sixth plane and having a magnetization direction that can switch between a first magnetization direction to a second magnetization direction, the magnetic reference layer, the non-magnetic tunnel barrier layer and the free magnetic layer forming a magnetic tunnel junction; and
a precessional spin current magnetic layer having a non-uniform moment density, the precessional spin current magnetic layer disposed in a seventh plane that is physically separated from the free magnetic layer and coupled to the free magnetic layer by a filter coupling layer that may induce ferromagnetic or antiferromagnetic coupling between the free magnetic layer and the filter layer.

2. The magnetic device of claim 1, wherein a first region includes a center of the precessional spin current magnetic layer, wherein a second region includes a perimeter of the precessional spin current magnetic layer, and wherein a moment density of the first region is greater than a moment density of the second region.

3. The magnetic device of claim 2, wherein the precessional spin current magnetic layer is formed from $Co_xFe_yB_z$, where y is in the range 40% to 70%, z is in the range 18% to 21%, and x+y+z=100%.

4. The magnetic device of claim 3, wherein a percentage of Fe in the first region is greater than a percentage of Fe in the second region.

5. The magnetic device of claim 4, wherein a ratio of the percentage of Fe in the first region to the percentage of Fe in the second region is in the range of 1.15 to 1.75.

6. The magnetic device of claim 2, wherein the second region is formed from $Co_xFe_yB_z$, where y is in the range 40% to 70%, z is in the range 18% to 21%, and x+y+z=100%, and wherein the first region is formed from Fe.

7. The magnetic device of claim 2, wherein the second region is formed from $Co_xFe_yB_z$, where y is in the range 40% to 70%, z is in the range 18% to 21%, and x+y+z=100%, and wherein the first region is formed from FeCo.

8. The magnetic device of claim 1 further comprising a first central region and a plurality of annular regions disposed around the central region, each annular region having a moment density that is less than a moment density of each region disposed therein.

9. The magnetic device of claim 8, wherein the precessional spin current magnetic layer is formed from $Co_xFe_yB_z$, where y is in the range 40% to 70%, z is in the range 18% to 21%, and x+y+z=100%.

10. The magnetic device of claim 9, wherein a percentage of Fe in the each annular region is less than a percentage of Fe in each region disposed therein.

11. A magnetic device, comprising:
a magnetic reference layer in a first plane, the magnetic reference layer having a magnetization vector that is perpendicular to the first plane and having a fixed magnetization direction;
a non-magnetic tunnel barrier layer in a second plane and disposed over the magnetic reference layer;
a free magnetic layer disposed in a third plane over the non-magnetic tunnel barrier layer, the free magnetic layer having a magnetization vector that is perpendicular to the third plane and having a magnetization direction that can switch between a first magnetization direction to a second magnetization direction, the magnetic reference layer, the non-magnetic tunnel barrier layer and the free magnetic layer forming a magnetic tunnel junction; and
a precessional spin current magnetic layer having a non-uniform moment density, the precessional spin current magnetic layer disposed in a fourth plane that is physically separated from the free magnetic layer and coupled to the free magnetic layer by a filter coupling layer that may induce ferromagnetic or antiferromagnetic coupling between the free magnetic layer and the filter layer.

12. The magnetic device of claim 11, wherein a first region includes a center of the precessional spin current magnetic layer, wherein a second region includes a perimeter of the precessional spin current magnetic layer, and wherein a moment density of the first region is greater than a moment density of the second region.

13. The magnetic device of claim 12, wherein the precessional spin current magnetic layer is formed from $Co_xFe_yB_z$, where y is in the range 40% to 70%, z is in the range 18% to 21%, and x+y+z=100%.

14. The magnetic device of claim 13, wherein a percentage of Fe in the first region is greater than a percentage of Fe in the second region.

15. The magnetic device of claim 14, wherein a ratio of the percentage of Fe in the first region to the percentage of Fe in the second region is in the range of 1.15 to 1.75.

16. The magnetic device of claim 12, wherein the second region is formed from $Co_xFe_yB_z$, where y is in the range 40% to 70%, z is in the range 18% to 21%, and x+y+z=100%, and wherein the first region is formed from Fe.

17. The magnetic device of claim 12, wherein the second region is formed from $Co_xFe_yB_z$, where y is in the range 40% to 70%, z is in the range 18% to 21%, and x+y+z=100%, and wherein the first region is formed from FeCo.

18. The magnetic device of claim 11 further comprising a first central region and a plurality of annular regions disposed around the central region, each annular region having a moment density that is less than a moment density of each region disposed therein.

19. The magnetic device of claim 18, wherein the precessional spin current magnetic layer is formed from $Co_xFe_yB_z$, where y is in the range 40% to 70%, z is in the range 18% to 21%, and x+y+z=100%.

20. The magnetic device of claim 19, wherein a percentage of Fe in the each annular region is less than a percentage of Fe in each region disposed therein.

21. A method for manufacturing a magnetic device comprising the steps of:
providing a magnetic tunnel junction including a magnetic reference layer, a non-magnetic tunnel barrier layer, and a free magnetic layer;
depositing a filter coupling layer over the free magnetic layer;
depositing a first material to form a precessional spin current magnetic layer over the filter coupling layer;
forming a partial pillar that includes the precessional spin current magnetic layer;
depositing a second material to further form the precessional spin current magnetic layer, the second material having a moment density that is less than a moment density of the first material;
depositing a hard mask layer over the precessional spin current magnetic layer;
forming a pillar that includes the precessional spin current magnetic layer, the filter coupling layer, the free magnetic layer, the non-magnetic tunnel barrier layer, and the magnetic reference layer such that the precessional spin current magnetic layer has a diameter that is different from a diameter of the free magnetic layer; and
depositing an electrical contact layer over the precessional spin current layer.

* * * * *